US011394209B2

(12) United States Patent
Yu et al.

(10) Patent No.: US 11,394,209 B2
(45) Date of Patent: Jul. 19, 2022

(54) METHOD AND DEVICE FOR CONTROLLING EXTERNAL DEVICE IN ACCORDANCE WITH ELECTRONIC DEVICE STATE

(71) Applicant: Samsung Electronics Co., Ltd., Gyeonggi-do (KR)

(72) Inventors: Tae-Hyeon Yu, Gyeonggi-do (KR); Han-Shil Choi, Seoul (KR); Ba-Da Kang, Gyeonggi-do (KR); Hayeon Kim, Gyeonggi-do (KR); Hyun-Seok Seo, Gyeonggi-do (KR)

(73) Assignee: Samsung Electronics Co., Ltd

( * ) Notice: Subject to any disclaimer, the term of this patent is extended or adjusted under 35 U.S.C. 154(b) by 471 days.

(21) Appl. No.: 16/497,263

(22) PCT Filed: Mar. 5, 2018

(86) PCT No.: PCT/KR2018/002559
§ 371 (c)(1),
(2) Date: Sep. 24, 2019

(87) PCT Pub. No.: WO2018/174426
PCT Pub. Date: Sep. 27, 2018

(65) Prior Publication Data
US 2020/0383235 A1 Dec. 3, 2020

(30) Foreign Application Priority Data

Mar. 24, 2017 (KR) .......................... 10-2017-0037698

(51) Int. Cl.
*H02J 7/00* (2006.01)
*G06F 1/16* (2006.01)
(Continued)

(52) U.S. Cl.
CPC .............. *H02J 7/00* (2013.01); *G06F 1/1626* (2013.01); *G06F 1/1632* (2013.01); *G06F 1/203* (2013.01);
(Continued)

(58) Field of Classification Search
CPC ......... H02J 7/00; H02J 7/0047; G06F 1/1632; G06F 11/30; G06F 1/206; G06F 11/3058; H05K 7/20136; H05K 7/20209
See application file for complete search history.

(56) References Cited

U.S. PATENT DOCUMENTS 6,029,119 A 2/2000 Atkinson
6,065,930 A * 5/2000 Sato ........................ G06F 1/206
416/37

(Continued)

FOREIGN PATENT DOCUMENTS

EP 3382499 A2 * 10/2018 ........... G06F 1/1632
JP 2007165982 6/2007
(Continued)

OTHER PUBLICATIONS

PCT/ISA/210 Search Report issued on PCT/KR2018/002559, pp. 5.
(Continued)

*Primary Examiner* — Pedro J Cuevas
(74) *Attorney, Agent, or Firm* — The Farrell Law Firm, P.C.

(57) ABSTRACT

Various embodiments of the present invention relate to a method and a device for controlling the operation of an external device on the basis of various states of an electronic device when the external device having a cooling function is connected in the electronic device. The electronic device according to various embodiments of the present invention comprises: an interface for connection with the external device; and a processer electrically connected to the inter-
(Continued)

face. The processor can detect connection of the external device by means of the interface, determine the state of the electronic device on the basis of at least the detection of the connection with the external device, and transmit a control signal relating to fan operation control of the external device to the external device by means of the interface on the basis of at least the state of the electronic device. Various embodiments are possible.

20 Claims, 17 Drawing Sheets

(51) Int. Cl.
　　*G06F 1/20*　　　(2006.01)
　　*H05K 7/20*　　　(2006.01)
　　*G06F 11/30*　　(2006.01)
(52) U.S. Cl.
　　CPC ............ *G06F 11/30* (2013.01); *H02J 7/0047* (2013.01); *H05K 7/20136* (2013.01); *H05K 7/20209* (2013.01)

(56) References Cited

U.S. PATENT DOCUMENTS

| | | | | |
|---|---|---|---|---|
| 8,475,507 | B2* | 7/2013 | Dewey | A61B 18/203 607/89 |
| 9,820,409 | B1* | 11/2017 | Ross | H05K 7/20736 |
| 10,130,007 | B2* | 11/2018 | Chen | G05B 15/02 |
| 10,531,586 | B2* | 1/2020 | Yoon | H05K 5/0017 |
| 10,691,185 | B2* | 6/2020 | Huang | G06F 1/206 |
| 10,707,688 | B2* | 7/2020 | Kang | H01R 31/065 |
| 10,785,887 | B2* | 9/2020 | Jeong | H02J 7/007192 |
| 2008/0174959 | A1 | 7/2008 | Sano et al. | |
| 2012/0123597 | A1* | 5/2012 | Cepulis | G06F 1/206 700/282 |
| 2012/0197357 | A1* | 8/2012 | Dewey | A61N 5/0616 607/89 |
| 2014/0245029 | A1 | 8/2014 | Jain et al. | |
| 2014/0346993 | A1* | 11/2014 | Mishima | H05K 7/20209 318/400.38 |
| 2015/0237765 | A1* | 8/2015 | Liu | G05B 15/02 700/275 |
| 2015/0355693 | A1* | 12/2015 | Chang | G06F 1/203 361/679.48 |
| 2016/0076544 | A1* | 3/2016 | Fan | H05K 7/20836 700/275 |
| 2016/0171967 | A1 | 6/2016 | Giaimo, III et al. | |
| 2016/0174271 | A1* | 6/2016 | Jeong | H04W 68/12 455/445 |
| 2016/0364360 | A1* | 12/2016 | Lim | G06F 1/266 |
| 2017/0017270 | A1 | 1/2017 | Suckle et al. | |
| 2017/0170974 | A1* | 6/2017 | Kang | H02J 7/342 |
| 2017/0187310 | A1* | 6/2017 | Hung | H02P 7/29 |
| 2017/0222459 | A1* | 8/2017 | Kang | H02J 7/007 |
| 2018/0143927 | A1* | 5/2018 | Kim | G06F 13/385 |
| 2018/0206354 | A1* | 7/2018 | Yoon | H04M 1/18 |
| 2018/0288898 | A1* | 10/2018 | Jeong | H02J 7/0091 |
| 2018/0339376 | A1* | 11/2018 | Knoener | F24F 11/64 |
| 2019/0235592 | A1* | 8/2019 | Huang | G06F 1/3287 |
| 2020/0389996 | A1* | 12/2020 | Jeong | H02J 50/12 |
| 2021/0161034 | A1* | 5/2021 | Jeong | H02J 7/0044 |

FOREIGN PATENT DOCUMENTS

| | | |
|---|---|---|
| JP | 4064482 | 3/2008 |
| JP | 2013020500 | 1/2013 |
| KR | 101463524 | 11/2014 |
| KR | 1020150021318 | 3/2015 |
| KR | 1020150121058 | 2/2018 |
| WO | WO-2021107504 A1 * | 6/2021 ............. H02J 50/10 |

OTHER PUBLICATIONS

PCT/ISA/237 Written Opinion issued on PCT/KR2018/002559, pp. 16.
Korean Office Action dated Aug. 9, 2021 issued in counterpart application No. 10-2017-0037698, 16 pages.
Korean Office Action dated Feb. 23, 2022 issued in counterpart application No. 10-2017-0037698, 17 pages.

* cited by examiner

METHOD AND DEVICE FOR CONTROLLING EXTERNAL DEVICE IN ACCORDANCE WITH ELECTRONIC DEVICE STATE

PRIORITY

This application is a National Phase Entry of International Application No. PCT/KR2018/002559, filed on Mar. 5, 2018, and claims priority to Korean Patent Application No. 10-2017-0037698, filed on Mar. 24, 2017, the contents of each of which are incorporated herein by reference.

BACKGROUND

1. Field

Various embodiments of the disclosure relate to a method and an apparatus for controlling an operation of an external device, which is provided with a cooling function, based on various states of an electronic device when the electronic device is connected with the external device.

2. Description of the Related Art

With the recent enhancement of digital technology, various types of electronic devices such as mobile communication terminals, smartphones, tablet personal computers (PCs), notebooks, personal digital assistants (PDAs), wearable devices, digital cameras, personal computers, or the like are widely used.

In recent years, various speech services (for example, a speech recognition function) based on speech recognition technology are developing and are being provided in electronic devices, in addition to a communication function and a multimedia replay function (for example, a video replay). According to an embodiment, an electronic device may provide various life convenience services such as mobile search, schedule management, calling, memo, music replay, or the like based on user's voice commands.

The electronic device may include a rechargeable battery and may be used by charging the battery. A high-capacity battery may be used to enable various service functions of the electronic device to operate for a long time.

SUMMARY

Heat emission may occur when a battery of an electronic device is being charged. When a quick charging mode is set (high voltage/current is set) to quickly charge a high-capacity battery, much heat may be emitted in comparison to a normal charging mode. In addition, much heat may be emitted when a function of the electronic device is performed while the battery is being charged. A related-art external device may include a cooling fan to reduce heat emission of the electronic device, but may only be provided with an on/off function of the cooling fan, which is an independent operation. Accordingly, the related-art external device may only provide the on/off function of the cooling fan, and thus fan auto control according to a state of the electronic device, which is connected (or mounted or docked onto) with the external device, is not considered.

For example, when the fan operates in the external device, the operation of the fan may cause a noise which may influence audio performance of the electronic device connected with the external device. According to an embodiment, when the electronic device receives an input of an audio signal through a microphone, a noise may be included in the audio signal due to the noise caused by the fan, and thus the audio signal may be distorted and an error may occur in processing the audio signal. In addition, when an audio signal should be outputted through a speaker in the electronic device, a user may not exactly hear the audio signal exactly due to the noise caused by the fan. Accordingly, users' needs for avoiding influence on the audio performance of electronic devices when the electronic device is connected with the external device and is charged and/or cooled are increasing.

Various embodiments disclose a method and an apparatus for controlling an operation of an external device provided with a cooling function, based on various states of an electronic device, when the electronic device is connected with the external device.

Various embodiments disclose a method and an apparatus for adaptively controlling a fan of an external device based on a state of an electronic device when the electronic device is connected with the external device and the fan of the external device operates.

Various embodiments disclose a method and an apparatus for preventing audio performance of an electronic device connected with an external device from being degraded, by automatically controlling a fan of the external device based on a state of the electronic device.

An electronic device according to various embodiments of the disclosure may include an interface configured to connect with an external device, and a processor electrically connected with the interface, wherein the processor is configured to: detect a connection with the external device by using the interface; determine a state of the electronic device based at least on the detection of the connection with the external device; and transmit a control signal related to a control of a fan operation of the external device to the external device by using the interface, based at least on the state of the electronic device.

An electronic device according to various embodiments of the disclosure may include an interface configured to electrically connect with an external device, one or more microphones, and a processor, wherein the processor is configured to: identify an operation mode of the electronic device; when the identified operation mode is a first operation mode, transmit, to the external device by using the interface, a first control signal to control an operation speed of a fan of the external device in a first method corresponding to the first operation mode; and, when the identified operation mode is a second operation mode, transmit, to the external device by using the interface, a second control signal to control the operation speed of the fan of the external device in a second method corresponding to the second operation mode.

An operating method of an electronic device according to various embodiments includes: detecting a connection with an external device by using an interface set to connect with the external device; determining a state of the electronic device based at least on the detection of the connection with the external device; and transmitting a command related to a control of a fan operation of the external device to the external device by using the interface, based at least on the state of the electronic device.

In various embodiments of the disclosure to achieve the above-described objects, a computer-readable recording medium that records a program for executing the method in a processor may be included.

According to the electronic device and the operating method thereof according to various embodiments, when the electronic device is connected with an external device provided with a cooling function, the electronic device can adaptively control a fan operation of the external device based on various states of the electronic device. According to various embodiments, when the electronic device is connected with the external device and the fan of the external device degrading audio performance of the electronic device operates, the electronic device can stably process audio signals. According to an embodiment, even when the fan of the external device operates, the electronic device can guarantee stable voice recognition and call quality, and can allow audio output signals to be well delivered to a user.

According to various embodiments, by automatically controlling the fan of the external device based on a state of the electronic device, the electronic device can maintain stability of the electronic device by considering a heat emission state of the electronic device, while preventing audio performance of the electronic device connected with the external device from being degraded. Usability, convenience, or stability of the electronic device can be enhanced by the electronic device according to various embodiments.

DETAILED DESCRIPTION

Figure 1:
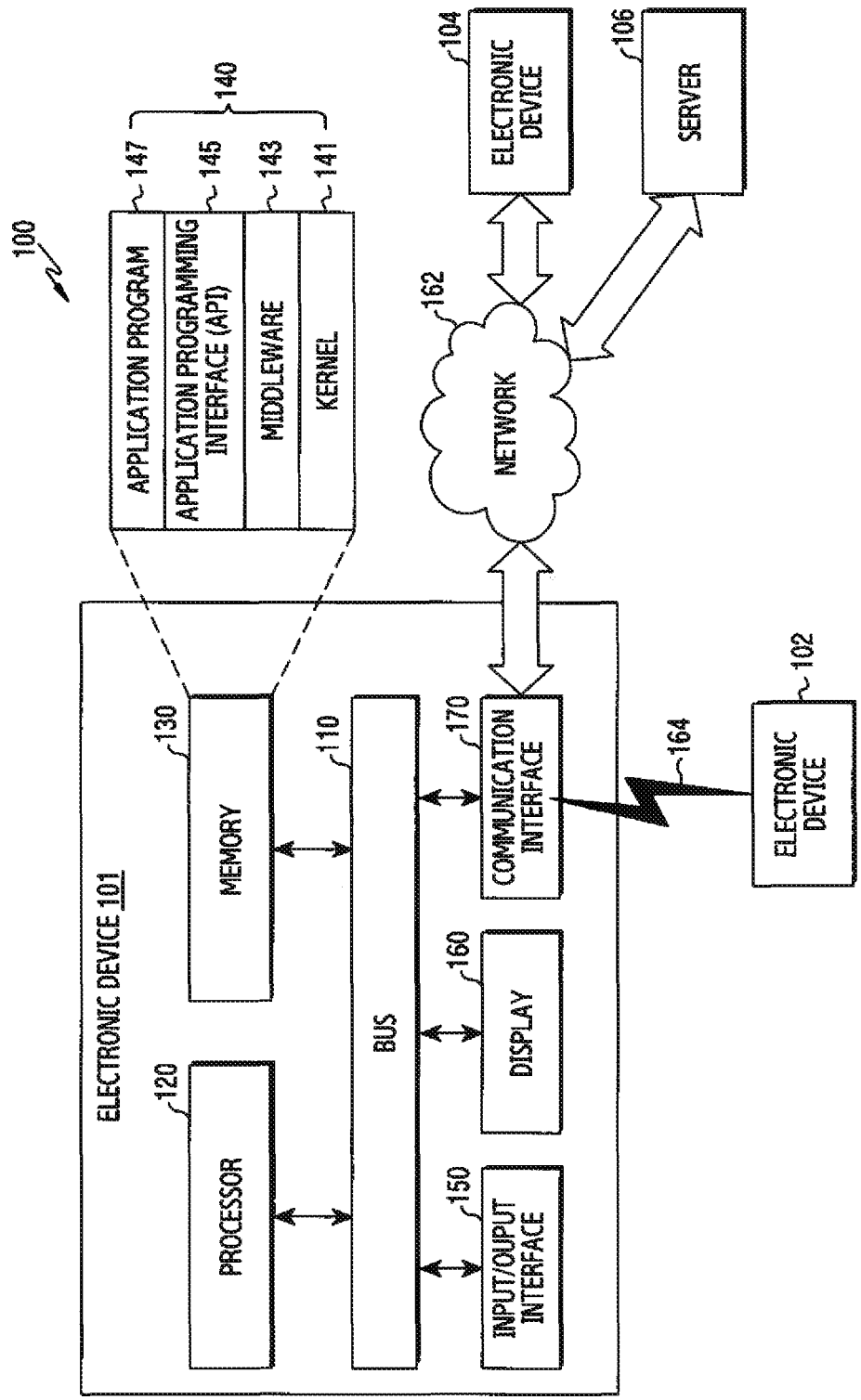
FIG. 1 is a view illustrating a network environment including an electronic device according to various embodiments of the disclosure.

Hereinafter, various exemplary embodiments of the present document are described with reference to the accompanying drawings. It should be understood, however, that it is not intended to limit the various exemplary embodiments of the present document to the particular form disclosed, but, on the contrary, it is intended to cover all modifications, equivalents, and alternatives falling within the spirit and scope of the various exemplary embodiments of the present document. Like reference numerals denote like components throughout the drawings.

A singular expression includes a plural concept unless there is a contextually distinctive difference therebetween. In the present document, an expression "A or B", "A and/or B", or the like may include all possible combinations of items enumerated together. Although expressions such as "1st", "2nd", "first", and "second" may be used to express corresponding constitutional elements, it is not intended to limit the corresponding constitutional elements. When a certain (e.g., 1st) constitutional element is mentioned as being "operatively or communicatively coupled with/to" or "connected to" a different (e.g., 2nd) constitutional element, the certain constitutional element is directly coupled with/to another constitutional element or can be coupled with/to the different constitutional element via another (e.g., 3rd) constitutional element.

An expression "configured to" used in the present document may be interchangeably used with, for example, "suitable for", "having the capacity to", "adapted to", "made to", "capable of", or "designed to" in a hardware or software manner according to a situation. In a certain situation, an expressed "a device configured to" may imply that the device is "capable of" together with other devices or components. For example, "a processor configured to perform A, B, and C" may imply a dedicated processor (e.g., an embedded processor) for performing a corresponding operation or a generic-purpose processor (e.g., Central Processing Unit (CPU) or an application processor) capable of performing corresponding operations by executing one or more software programs stored in a memory device.

An electronic device according to various embodiments of the present disclosure, for example, may include at least one of a smartphone, a tablet personal computer (PC), a mobile phone, a video phone, an electronic book (e-book) reader, a desktop PC, a laptop PC, a netbook computer, a workstation, a server, a personal digital assistant (PDA), a portable multimedia player (PMP), an MP3 player, a mobile medical appliance, a camera, and a wearable device (e.g., smart glasses, a head-mounted-device (HMD), electronic clothes, an electronic bracelet, an electronic necklace, an electronic appcessory, an electronic tattoo, a smart mirror, or a smart watch).

According to some embodiments, the electronic device (ex. home appliance) may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device according to various embodiments of the present disclosure may be a combination of one or more of the aforementioned various devices. The electronic device according to some embodiments of the present disclosure may be a flexible device. Further, the electronic device according to an embodiment of the present disclosure is not limited to the aforementioned devices, and may include a new electronic device according to the development of technology. Hereinafter, an electronic device according to various embodiments will be described with reference to the accompanying drawings. As used herein, the term "user" may indicate a person who uses an electronic device or a device (e.g., an artificial intelligence electronic device) that uses an electronic device.

FIG. 1 is a diagram illustrating an example network environment including an electronic device according to various example embodiments of the present disclosure.

Referring to FIG. 1, an electronic device 101 in a network environment 100 in various embodiments is disclosed. The electronic device 101 may include a bus 110, a processor 120 (for example, a processor including a processing circuitry), a memory 130, an input/output interface 150, a display 160, and a communication interface 170. According to an example embodiment of the present disclosure, the electronic device 101 may omit at least one of the above components or may further include other components.

The bus 110 may include, for example, a circuit which interconnects the components 110 to 170 and delivers a communication (e.g., a control message and/or data) between the components 110 to 170.

The processor 120 may include various processing circuitry, such as, for example, and without limitation, one or more of a dedicated processor, a Central Processing Unit (CPU), an Application Processor (AP), and a Communication Processor (CP). The processor 120 may carry out, for example, calculation or data processing relating to control and/or communication of at least one other component of the electronic device 101. A processing (or control) operation of the processor 120 according to various embodiments will be described in detail with reference to the drawings which will be described below.

The memory 130 may include a volatile memory and/or a non-volatile memory. The memory 130 may store, for example, commands or data relevant to at least one other component of the electronic device 101. According to an embodiment of the present disclosure, the memory 130 may store software and/or a program 140. The program 140 may include, for example, a kernel 141, middleware 143, an Application Programming Interface (API) 145, and/or application programs (or "applications") 147. At least some of the kernel 141, the middleware 143, and the API 145 may be referred to as an Operating System (OS).

The memory 130 may store one or more programs executed by the processor 120, and may perform a function of temporarily storing inputted/outputted data. The inputted/outputted data may include, for example, data such as a video, an image (for example, a photo), function (or application) execution-related information, or an audio. According to various embodiments, the memory 130 may serve to store obtained data, and data obtained in real time may be stored in a temporary storage device (for example, a buffer), and data determined to be stored may be stored in a long-term storable storage device. The memory 130 may include a computer-readable recording medium that records a program for executing the method according to various embodiments at the processor 120.

The kernel 141 can, for example, control or manage system resources (e.g., the bus 110, the processor 120, the memory 130, etc.) that are used for executing operations or functions implemented in other programs (e.g., the middleware 143, the API 145, or the application program 147). Also, the kernel 141 can provide an interface that is capable of controlling or managing the system resources by enabling the middleware 143, the API 145, or the application program 147 to gain access to the individual constituent element of the electronic device 101.

The middleware 143 can, for example, perform a relay role of enabling the API 145 or the application program 147 to communicate and exchange data with the kernel 141. Also, the middleware 143 can process one or more work requests received from the application program 147 in accordance with the order of priority. For example, the middleware 143 may assign at least one of the application programs 147 a priority to use system resources (for example, the bus 110, the processor 120, or the memory 130) of the electronic device 101, and may process one or more task requests.

The API 145 is, for example, an interface of enabling the application program 147 to control a function of the kernel 141 or the middleware 143, and can, for example, include at least one interface or function (e.g., instruction) for file control, window control, picture processing, character control, etc.

The input/output interface 150 may forward a command or data inputted from a user or an external device to other element(s) of the electronic device 101, or may output a command or data received from other element(s) of the electronic device 101 to the user or the external device. For example, a wired/wireless headphone port, an external charger port, a wired/wireless data port, a memory card port, an audio input/output port, a video input/output port, an earphone port, or the like may be included in the input/output interface 150.

The display 160 may include, for example, a liquid crystal display (LCD), a light emitting diode (LED) display, an organic LED (OLED) display, an active matrix OLED (AMOLED), a micro-electromechanical systems (MEMS) display, or an electronic paper display. The display 160 may display, for example, various contents (for example, a text, an image, a video, an icon, and/or a symbol) for the user. The display 160 may include a touch screen, and may receive, for example, a touch, a gesture, proximity, or hovering input using an electronic pen or a part of user's body.

The display 160 may show a visual output to the user, for example. The visual output may be shown in the form of a text, a graphic, a video or a combination thereof. The display 160 may display (output) a variety of information processed at the electronic device 101. For example, the display 160 may display a user interface (UI) or a graphic UI (GUI) related to use of the electronic device 101. According to various embodiments, the display 160 may display various user interfaces (for example, UIs or GUIs) related to operations performed by the electronic device 101 (for example, a content display operation, a state information display operation, or the like).

In various embodiments, the display 160 may include a flat display or a curved display (or a bended display) that can be bent, crooked, or rolled through a thin, flexible substrate without a damage like paper. The curved display may be secured to a housing (or a bezel, a body) and may maintain a crooked state. In various embodiments, the electronic device 101 may be implemented by using a display device that can be crooked or uncrooked like a flexible display, in addition to a curved display.

In various embodiments, the display 160 may give flexibility so as to be folded or unfolded by substituting a glass substrate surrounding liquid crystals in the LCD, LED, OLED, or AMOLED with a plastic substrate. In various embodiments, the display 160 may be extended to at least one side (for example, at least one of a left side, a right side, an upper side, a lower side) of the electronic device 101, and may be bended by a radius of curvature (for example, a radius of curvature of 5 cm, 1 cm, 7.5 mm, 5 mm, 4 mm, etc.) within which the curved display is operable or less, and may be secured to the side of the housing. However, this should not be considered as limiting, and the display 160 according to various embodiments may be implemented at a right angle without a radius of curvature.

The communication interface 170 may establish communication between the electronic device 101 and an external device (for example, a first external electronic device 102, a second external electronic device 104, or a server 106). For example, the communication interface 170 may be connected to a network 162 through wireless communication or wired communication to communicate with the external device.

The wireless communication may include cellular communication using at least one of, for example, long term evolution (LTE), LTE-Advance (LTE-A), code division multiple access (CDMA), wideband CDMA (WCDMA), universal mobile telecommunications system (UMTS), wireless broadband (WiBro), or global system for mobile communications (GSM), or the like.

According to an embodiment, the wireless communication may include at least one of, for example, wireless fidelity (WiFi), light fidelity (LiFi), wireless gigabit alliance (WiGig), Bluetooth, Bluetooth low energy (BLE), Zigbee, near field communication (NFC), magnetic secure transmission, radio frequency (RF), or body area network (BAN), as shown by element 164 of FIG. 1.

According to an embodiment, the wireless communication may include GNSS. The GNSS may be, for example, a global positioning system (GPS), a global navigation satellite system (Glonass), a Beidou navigation satellite system (hereinafter, "Beidou") or Galileo, the European global satellite-based navigation system. Hereinafter, in the disclosure, "GPS" may be interchangeably used with "GNSS."

The wired communication may include at least one of, for example, a universal serial bus (USB), a high definition multimedia interface (HDMI), recommended standard 232 (RS-232), power line communication or plain old telephone service (POTS), or the like.

The network 162 may include a telecommunications network, for example, at least one of a computer network (for example, a local area network (LAN) or a wide area network (WAN)), Internet, or a telephone network.

Each of the first external electronic device 102 and the second external electronic device 104 may be the same type or different type of device as or from the electronic device 101. According to various embodiments, all or a part of the operations executed in the electronic device 101 may be executed in one or a plurality of external electronic devices (for example, the electronic devices 102, 104, or the sever 106).

According to an embodiment, when the electronic device 101 has to perform some functions or services automatically or in response to a request, the electronic device 101 may make a request for performing at least some functions relating thereto to another device (for example, the electronic device 102 or 104 or the server 106) instead of performing the functions or services by itself or in addition. Another electronic device (for example, the electronic device 102 or 104, or the server 106) may execute the requested functions or the additional functions, and may deliver a result of the execution to the electronic device 101. The electronic device 101 may process the received result as it is or additionally to provide the requested functions or services. To achieve this, for example, cloud computing, distributed computing, or client-server computing technology may be used.

The server 106 may include at least one of, for example, an integration server, a provider server (or a communication operator server), a content server, an internet server, a cloud server, a web server, a secure server, or a certification server.

Figure 2:
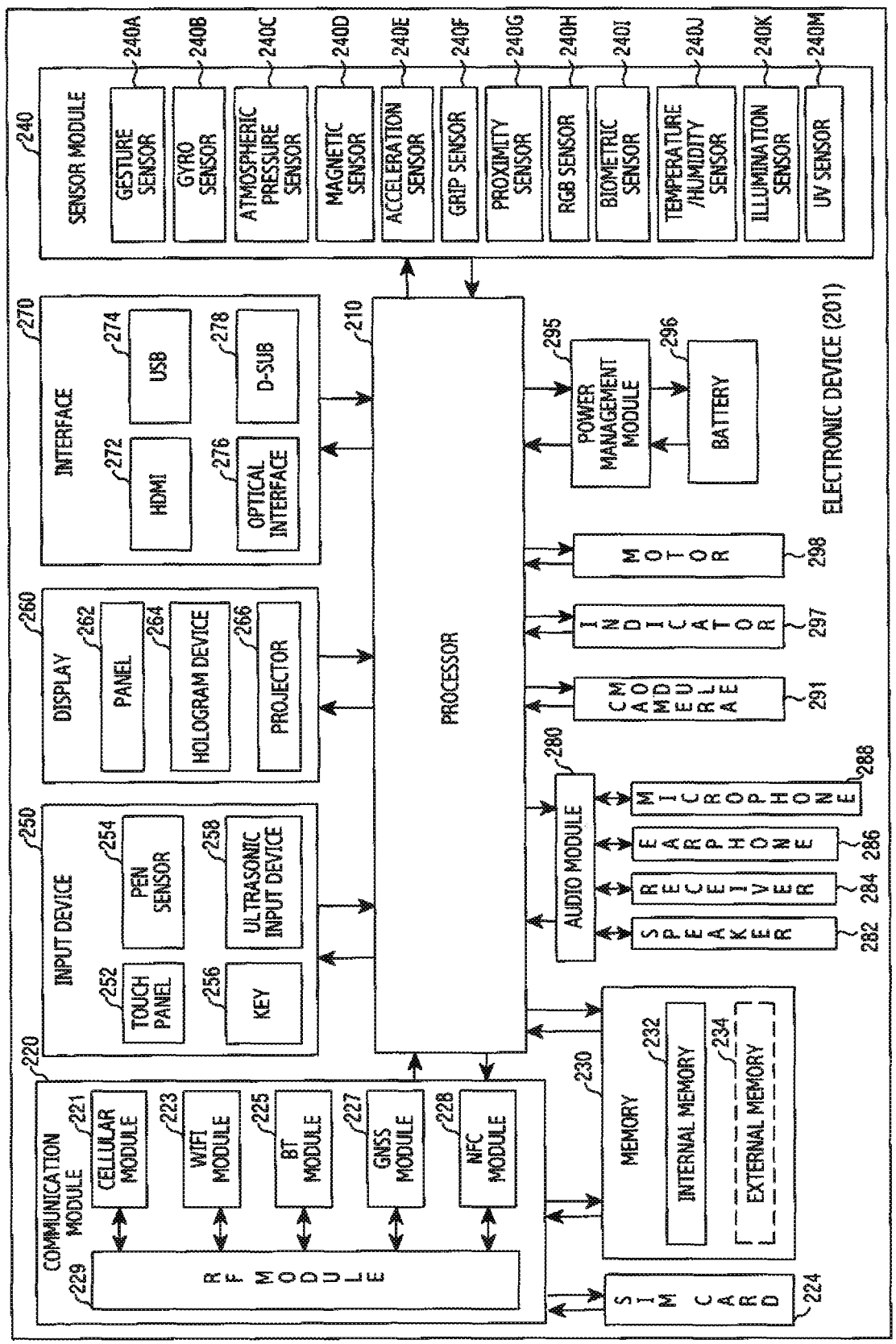
FIG. 2 is a block diagram of an electronic device according to various embodiments of the disclosure.

FIG. 2 illustrates a detailed block diagram of an electronic device according to an exemplary embodiment of the present disclosure.

The electronic device 201 may be, for example, the entire electronic device 100 illustrated in FIG. 1 or part of the electronic device 101. The electronic device 201 may include one or more processors (for example, an AP) 210, a communication module 220, a subscriber identity module (SIM) 224, a memory 230, a sensor module 240, an input device 250, a display 260, an interface 270, an audio module 280, a camera module 291, a power management module 295, a battery 296, an indicator 297, and a motor 298 (for example, a vibration motor).

In various embodiments, the electronic device 201 may be implemented to have more components or fewer components than the components illustrated in FIG. 2 since the components illustrated in FIG. 2 are not essential. For example, the electronic device 201 according to various embodiments may not include some components according to its type. According to various embodiments, the above-described components of the electronic device 201 may be seated in a housing (or a bezel, or a main body) of the electronic device 201 or may be formed on an exterior thereof.

The processor 210 may execute, for example, an operating system or an application program to control a plurality of hardware or software components coupled with the processor 210, and may perform various data processing or computation. The processor 210 may be implemented by using a system on chip (SoC), for example. According to an embodiment, the processor 210 may further include a graphic processing unit (GPU) and/or an image signal processor (ISP).

The processor 210 may include at least a part (for example, a cellular module 221) of the components illustrated in FIG. 2. The processor 210 may load a command or data received from at least one of the other components (for example, a nonvolatile memory) in a volatile memory, may process the command or the data, and may store resulting data in the nonvolatile memory.

According to various embodiments, the processor 210 may include one or more processors. For example, the processor 210 may include a communication processor (CP), an application processor (AP), an interface (for example, a general purpose input/output (GPIO)) or an internal memory as separate components, or may integrate the same into one or more integrated circuitry. According to an embodiment, the application processor may execute various software programs to perform various functions for the electronic device 201, and the communication processor may perform processing and control for voice communication and data communication. The processor 210 may serve to execute a specified software module (for example, an instruction set) stored in the memory 230 to perform specified various functions corresponding to the module.

In various embodiments, the processor 210 may control an overall operation of the electronic device 201. In various embodiments, the processor 210 may control operations of a hardware module such as the audio module 280, the interface 270, the display 260, the camera module 291, the communication module 220, the power management module 295, the sensor module 240, or the motor 298. According to various embodiments, the processor 210 may be electrically connected with the display 260, the memory 230, the communication module 220, the interface 270, and/or the motor 298 of the electronic device 201.

According to various embodiments, the processor 210 may process operations related to determining a state of the electronic device 201 based on various context awareness technologies, and adaptively controlling a fan of an external device based on the state of the electronic device 201. According to various embodiments, when the electronic device 201 is connected with the external device, the processor 210 may control a charging operation of the electronic device 201 based on a charging power supplied from the external device. According to various embodiments, in response to the connection between the electronic device 201 and the external device being detected, the processor 210 may analyze a state related to the electronic device 201 and may control a fan operation of the external device based on a result of the analysis. According to various embodiments, in response to the connection between the electronic device 201 and the external device being detected, the processor 210 may process an operation related to controlling a microphone path of the electronic device 201.

The processing (or control) operation of the processor 210 according to various embodiments will be described in detail with reference to the drawings, which will be described below.

The communication module 220 may have the same or similar configuration as or to that of the communication interface 170 illustrated in FIG. 1. The communication module 220 may include, for example, a cellular module 221, a WiFi module 223, a Bluetooth module 225, a GNSS module 227, an NFC module 228, and a radio frequency (RF) module 229. The communication module 220 may further include, for example, a WiGig module (not shown) although it is not illustrated. According to an embodiment, the WiFi module 223 and the WiGig module (not shown) may be integrated into one chip.

The cellular module 221 may provide, for example, voice communication, video communication, a texting service, or an Internet service through a communication network. According to an embodiment, the cellular module 221 may identify and authenticate the electronic device 201 in the communication network by using a subscriber identification module (for example, a subscriber identification module (SIM) card) 224. According to an embodiment, the cellular module 221 may perform at least some of the functions provided by the processor 210. According to an embodiment, the cellular module 221 may include a communication processor (CP). According to an embodiment, at least some (for example, two or more) of the cellular module 221, the WiFi module 223, the Bluetooth module 225, the GNSS module 227, or the NFC module 228 may be included in one integrated chip (IC) or IC package.

The RF module 229 may exchange communication signals (for example, RF signals), for example. The RF module 229 may include, for example, a transceiver, a power amp module (PAM), a frequency filter, a low noise amplifier (LNA), or an antenna. According to another embodiment, at least one of the cellular module 221, the WiFi module 223, the Bluetooth module 225, the GNSS module 227, or the NFC module 228 may exchange RF signals through a separate RF module.

The WiFi module 223 may indicate a module for wirelessly accessing the Internet and forming a wireless local area network (LAN) link with an external device (for example, another electronic device 102 or the server 106). The WiFi module 223 may be embedded in or provided outside the electronic device 201. The wireless Internet technology may use WiFi, WiGig, Wibro, world interoperability for microwave access (WiMax), high speed downlink packet access (HSDPA), or millimeter wave (mmWave). The WiFi module 223 may transmit various data of the electronic device 201 to the outside or receive data from the outside by interworking with an external device (for example, another electronic device 104, etc.) which is directly connected with the electronic device 201 or connected via a network (for example, a wireless Internet network) (for example, the network 162). The WiFi module 223 may always remain in an on-state, or may be turned on/turned off according to setting of the electronic device or a user input.

The Bluetooth module 225 and the NFC module 228 may indicate, for example, short-range communication modules to perform short range communication. The short-range communication technology may use Bluetooth, Bluetooth low energy (BLE), radio frequency identification (RFID), infrared data association (IrDA), ultra-wideband (UWB), Zigbee, or NFC. The short-range communication module may transmit various data of the electronic device 201 to an external device or receive data from the external device by interworking with the external device (for example, another electronic device 102, etc.) connected with the electronic device 201 via a network (for example, a short-range communication network). The short-range communication module (for example, the Bluetooth module 225 and the NFC module 228) may always remain in an on-state, or may be turned on/turned off according to setting of the electronic device 201 or the user input.

The subscriber identification module 224 may include, for example, a card or an embedded SIM including the subscriber identification module, and may include unique identification information (for example, an integrated circuit card identifier (ICCID)) or subscriber information (for example, international mobile subscriber identity (IMSI)).

The memory 230 (for example, the memory 130) may include, for example, an internal memory 232 or an external memory 234. For example, the internal memory 232 may include at least one of a volatile memory (for example, a dynamic random access memory (DRAM), a synchronous RAM (SRAM), or a synchronous dynamic RAM (SDRAM)), and a nonvolatile memory (for example, a one-time programmable read only memory (OTPROM), a programmable ROM (PROM), an erasable and programmable ROM (EPROM), an electrically erasable and programmable ROM (EEPROM), a mask ROM, a flash ROM, a flash memory, a hard drive, or a solid state drive (SSD)). The external memory 234 may include a flash drive, for example, compact flash (CF), secure digital (SD), micro secure digital (Micro-SD), mini secure digital (Mini-SD), extreme digital (xD), multimedia card (MMC), a memory stick, or the like. The external memory 234 may be functionally or physically connected with the electronic device 201 through various interfaces.

In various embodiments, the memory 230 may store one or more programs, data, or instructions related to the processor 210 adaptively controlling an operation of a fan of an external device based on various states of the electronic device 201 when the electronic device 201 is connected with the external device provided with a cooling function. According to various embodiments, the memory 230 may store one or more programs, data or instructions related to the processor 210 processing an operation related to preventing audio performance of the electronic device 201 connected with the external device from being degraded, by automatically controlling the fan of the external device based on a state of the electronic device 201.

According to various embodiments, the memory 230 may store control commands (or control signals) for respective states of the electronic device 201 in the form of a lookup table (or a mapping table), in relation to the processor 210 controlling the fan of the external device according to various states (for example, temperature, an application) of the electronic device 201.

The memory 230 may include an extended memory (for example, the external memory 234) or an internal memory (for example, the internal memory 232). The electronic device 201 may operate in relation to a web storage which performs a storage function of the memory 230 over the Internet.

The memory 230 may store one or more pieces of software (or software modules). For example, the software component may include an operating system software module, a communication software module, a graphic software module, a user interface software module, a moving picture experts group (MPEG) module, a camera software module, or one or more application software modules. In addition, since a module which is a software component may be represented as a set of instructions, the module may be represented as an instruction set. The module may also be represented as a program. In various embodiments of the disclosure, the memory 230 may include an additional module (instructions) in addition to the above-described modules. Alternatively, some of the modules (instructions) may not be used if necessary.

The operating system software module may include various software components which control a normal system operation. Controlling such a normal system operation may refer to, for example, managing and controlling a memory, controlling and managing storage hardware (device), or controlling and managing power. In addition, the operating system software module may perform a function of smoothly performing communication between various pieces of hardware (devices) and software components (modules).

The communication software module may enable communication with another electronic device, such as a wearable device, a smartphone, a computer, a server, or a portable terminal, through the communication module 220 or the interface 270. In addition, the communication software module may be configured by a protocol structure corresponding to a corresponding communication method.

The graphic software module may include various software components for providing and displaying graphics on the display 260. In various embodiments, the term "graphics" may be used as a meaning including a text, a web page, an icon, a digital image, a video, an animation, or the like.

The user interface software module may include various software components related to a user interface (UI). For example, the UI software module may include information regarding how the state of the UI is changed or in what condition the state of the UI is changed.

The MPEG module may include a software component which enables processing and functions (for example, generating, replaying, distributing, and transmitting a content) related to digital contents (for example, a video, an audio, etc.).

The camera software module may include a camera-related software component which enables processing and functions related to a camera.

The application module may include a web browser including a rendering engine, an email, an instant message, word processing, keyboard emulation, an address book, a touch list, a widget, digital right management (DRM), iris scan, context cognition, voice recognition, a position determining function, a location-based service, etc. According to various embodiments, the application module may include a health care (for example, measuring exercise or blood glucose) or environmental information (for example, atmospheric pressure, humidity, or temperature information) providing application, etc. According to various embodiments, the application module may include one or more applications which perform operations of determining a state of the electronic device 201 based on various context awareness technologies, and of adaptively controlling a fan of an external device based on the state of the electronic device 201.

The sensor module 240 may measure, for example, a physical quantity or may detect an operation state of the electronic device 201, and may convert the measured or detected information to an electrical signal. The sensor module 240 may include at least one of, for example, a gesture sensor 240A, a gyro sensor 240B, a barometer sensor 240C, a magnetic sensor 240D, an acceleration sensor 240E, a grip sensor 240F, a proximity sensor 240G, a color sensor 240H (for example, a red, green, blue (RGB) sensor), a medical sensor 240I, a temperature/humidity sensor 240J, an illuminance sensor 240K, or a ultra violet (UV) sensor 240M.

Additionally or alternatively, the sensor module 240 may include, for example, an E-nose sensor, an electromyography (EMG) sensor, an electroencephalogram (EEG) sensor, an electrocardiogram (ECG) sensor, an infrared (IR) sensor, an iris sensor, and/or a finger scan sensor. The sensor module 240 may further include a control circuit for controlling at least one sensor included therein. According to an embodiment, the electronic device 201 may further include a processor which is a portion of the processor 210 or a separate element from the processor 210 and is configured to control the sensor module 240 (for example, a low power processor, a micro controller unit (MCU), a micro processor unit (MPU)), and the processor 210 may control the sensor module 240 while the processor 210 remains at a sleep state.

The input device 250 may include, for example, a touch panel 252, a (digital) pen sensor 254, a key 256, or an ultrasonic input device 258.

The touch panel 252 may use at least one of a capacitive, resistive, infrared or ultrasonic method. In addition, the touch panel 252 may further include a control circuit. The touch panel 252 may further include a tactile layer to provide a tactile reaction to a user.

The (digital) pen sensor 254 may be, for example, a portion of a touch panel or may include an additional sheet for recognition. The key 256 may include, for example, a physical button, an optical key, or a keypad. The ultrasonic input device 258 may detect an ultrasonic wave, which is generated from an input tool, through a microphone 288, and may identify data corresponding to the detected ultrasonic wave. According to various embodiments, the input device 250 may include an electronic pen. According to various embodiments, the input device 250 may be implemented to receive an input of a force touch.

The display 260 (for example, the display 160) may include a panel 262, a hologram device 264, a projector 266, and/or a control circuit for controlling the aforementioned elements.

The panel 262 may be implemented to be flexible, transparent, or wearable, for example. The panel 262 and the touch panel 252 may be integrated into one or more modules. According to an embodiment, the panel 262 may include a pressure sensor (or a force sensor) for measuring an intensity of pressure on a user's touch. The pressure sensor may be integrated into the touch panel 252 or may be implemented with one or more sensors separate from the touch panel 252.

The panel 262 may be seated on the display 260, and may detect a user input contacting or approaching a surface of the display 260. The user input may include a touch input or a proximity input which is inputted based on at least one of a single touch, a multi touch, hovering, or an air gesture. The panel 262 may receive a user input for initiating an operation related to use of the electronic device 201, and may generate an input signal according to the user input.

The panel 262 may be configured to convert a change in pressure applied to a specific portion of the display 260 or in capacitance generated at a specific portion of the display 260 into an electric input signal. The panel 262 may detect a position and an area of a place on the surface of the display 260 where an input tool (for example, a user finger, an electronic pen, etc.) touches or approaches. In addition, the panel 262 may be implemented to also detect pressure (for example, force touch) when a user touches according to an applied touch method.

The hologram device 264 may display a stereoscopic image in a space using a light interference phenomenon. The projector 266 may project light onto a screen so as to display an image. The screen may be disposed inside or outside the electronic device 201.

The interface 270 may include, for example, an HDMI 272, a USB 274, an optical interface 276, or a D-subminiature (D-sub) 278. The interface 270 may be included, for example, in the communication interface 170 illustrated in FIG. 1. Additionally or alternatively, the interface 270 may include, for example, a mobile high definition link (MHL) interface, an SD card/multi-media card (MMC) interface, or an infrared data association (IrDA) standard interface.

The interface 270 may receive data and power from another electronic device, and may forward the data or power to the respective components in the electronic device 201. The interface 270 may transmit internal data of the electronic device 201 to another electronic device. For example, a wired/wireless headphone port, an external charger port, a wired/wireless data port, a memory card port, an audio input/output port, a video input/output port, an earphone port, etc. may be included in the interface 270.

According to various embodiments, the interface 270 (for example, the USB 274) may serve as an interface with all external devices connected with the electronic device 201. In various embodiments, the interface 270 (for example, the USB 274) may include a USB type C (type C) interface (hereinafter, referred to as a type C interface). According to an embodiment, the type C interface may support a connection with an external device (for example, a charging pad, a docking station, etc.), may support communication paths (for example, a first communication path, a second communication path) according to different standards (for example, a first standard (for example, USB 3.1), a second standard (for example, USB 2.0), etc.), and may support data communication with the external device based on at least a part of the communication paths. For example, the type C interface may support first data communication by the first communication path according to the first standard between the electronic device 201 and the external device, and simultaneously, may support second data communication by the second communication path according to the second standard. In various embodiments, the first standard may support higher-speed data communication than the second standard.

According to an embodiment, a connection state between the electronic device 201 and the external device may be detected through a configuration channel (CC) (for example, CC1 or CC2) pin (terminal) of the type C interface.

According to various embodiments, when the electronic device 201 and the external device are connected with each other through the type C interface, the electronic device 201 and the external device may be identified as a host (for example, a downstream facing port (DFP)) and a device (or a slave) (for example, a upstream facing port (UFP)) and may operate. This may be designated through the CC (for example, CC1 or CC2) terminal of the type C interface. For example, the type C interface may have CC1, CC2 for recognizing a connector coupling direction and for digital data communication, and a connection method using the type C interface may define roles of the host (DFP) and the device (UFP) by pull-up (Rp) or current sourcing and pull-down (Rd). In the type C interface, a side having pull-down (Rd) may be defined as the device (UFP), and the host (DFP) may supply power through a power supply pin (for example, VBUS, VCONN) as demanded by the device (UFP).

In general, when the electronic devices (for example, the electronic device 201, the external device) are designated as the host (DFP) and the device (UFP), the electronic device operating as the host (DFP) may forward data to the electronic device operating as the device (UFP). First, the electronic device may transmit data through transmission terminals (for example, the first communication path) of the first standard (for example, USB 3.1), each of which is designated as two pairs in the type C interface. Alternatively, when the electronic devices are not compatible with the first standard, data may be transmitted through transmission terminals (for example, the second communication path) of the second standard (for example, USB 2.0) designated as one pair.

For example, the type C interface may include respective data communication paths corresponding to different standards (for example, the first standard, the second standard) for data transmission. According to an embodiment, the type C interface may be divided into the first communication path for data communication (for example, super high (super speed plus (SSP), 10 Gbps) communication) based on a communication speed according to the first standard (for example, USB 3.1), and the second communication path for data communication (for example, high speed (480 Mbps) communication) based on a communication speed according to the second standard (for example, USB 2.0). When the electronic devices are connected with each other through the type C interface and the electronic device operating as the host (DFP) transmits data to the electronic device operating as the device (UFP), data communication may be achieved through the first communication path (for example, a path of standards having high data transmission speed is set first) of the first standard having a high priority (for example, having a high communication speed), first.

In the case of the type C interface, all of data connection and control may be exchanged as digital signals through the CC (for example, CC1 and CC2).

The audio module 280 may convert a sound and an electric signal in dual directions, for example. At least a portion of the audio module 280 may be included, for example, in the input/output interface 145 illustrated in FIG. 1.

The audio module 280 may process, for example, sound information that is inputted or outputted through a speaker 282, a receiver 284, an earphone 286, or a microphone 288. The audio module 280 may transmit an audio signal inputted from the processor 210 to an output device (for example, the speaker 282, the receiver 284, or the earphone 286), and may transmit an audio signal such as a voice inputted from an input device (for example, the microphone 280) to the processor 210. The audio module 280 may convert voice/acoustic data into an audible sound through the output device under control of the processor 210, and may output the audible sound, and may convert an audio signal such as a voice received from the input device into a digital signal and may transmit the digital signal to the processor 210.

The speaker 282 or the receiver 284 may output audio data which is received from the communication module 220 or stored in the memory 230. The speaker 282 or the receiver 284 may output acoustic signals related to various operations (functions) performed in the electronic device 201. The microphone 288 may receive an external acoustic signal and may process the signal into electric voice data. In the microphone 288, various noise reduction algorithms may be implemented to remove noises generated in the process of receiving external acoustic signals. The microphone 288 may serve to input audio streaming such as a voice command.

The camera module 291 may be, for example, a device for shooting a still image or a video, and according to an embodiment, the camera module 291 may include one or more image sensors (for example, a front-facing sensor or a rear-facing sensor), a lens, an image signal processor (ISP), or a flash (for example, an LED or a xenon lamp).

According to various embodiments, the camera module 291 may indicate a configuration for supporting a photographing function of the electronic device 201. The camera module 291 may photograph a certain subject under control of the processor 210 and may transmit photographing data (for example, an image) to the display 260 and the processor 210.

According to various embodiments, the camera module 291 may include, for example, a first camera (for example, a color (RGB) camera) to obtain color information, and a second camera (for example, an infrared (IR) camera) to obtain depth information (for example, location information, distance information of a subject). According to an embodiment, the first camera may be a front-facing camera provided on a front surface of the electronic device 201. According to various embodiments, the front-facing camera may be substituted with the second camera, and the first camera may not be provided on the front surface of the electronic device 201. According to various embodiments, the first camera may be disposed on a front surface of the electronic device 201 along with the second camera. According to an embodiment, the first camera may be a rear-facing camera provided on a rear surface of the electronic device 201. According to an embodiment, the first camera may include both the front-facing camera and the rear-facing camera which are provided on the front surface and the rear surface of the electronic device 201, respectively.

The camera module 291 may include an image sensor. The image sensor may be implemented by using a charged coupled device (CCD) or a complementary metal-oxide semiconductor (CMOS).

The power management module 295 may manage, for example, power of the electronic device 201. According to an embodiment, the power management module 295 may include a power management integrated circuit (PMIC), a charger IC, a battery or a fuel gauge (for example, a battery gauge).

The PMIC may have a wired charging method and/or a wireless charging method. The wireless charging method may include, for example, a magnetic resonance method, a magnetic induction method or an electromagnetic wave method. The PMIC may further include an additional circuit for wirelessly charging, for example, a coil loop, a resonance circuit, or a rectifier, etc. The fuel gauge may measure, for example, a remaining capacity of the battery 296 and a voltage, current or temperature thereof while the battery is charged. The battery 296 may include, for example, a rechargeable battery and/or a solar battery.

The indicator 297 may display a specific state of the electronic device 201 or a portion thereof (for example, the processor 210), such as a booting state, a message state, a charging state, or the like.

The motor 298 (for example, a vibration motor) may convert an electrical signal into a mechanical vibration and may generate vibration, a haptic effect, or the like. According to various embodiments, the electronic device 201 may include a motor driving controller (not shown), and the motor 298 may be driven under control of the motor driving controller. According to an embodiment, the processor 210 may apply a signal related to generation of a vibration to the motor driving controller, and the motor driving controller may output a motor driving signal corresponding to the signal received from the processor 210 to the motor 298. The motor 298 may be driven by the motor driving signal received from the motor driving controller, and may generate a vibration.

The motor 298 is described in various embodiments by way of an example, but various embodiments are not limited thereto. For example, a vibration generation device (or module) generating a vibration like the motor 298 may be implemented in various embodiments. The vibration generation device may include, for example, a vibrator, an actuator, or a haptic generation device in addition to the motor 298. In various embodiments, an operation related to generation and occurrence of a vibration may be performed by one or more vibration generation devices.

According to various embodiments, the electronic device 201 may include a mobile TV supporting device (for example, a GPU) for processing media data according to the standards of digital multimedia broadcasting (DMB), digital video broadcasting (DVB), MediaFlo™, or the like.

Each of the elements described in the disclosure may be configured with one or more components, and the names of the elements may be changed according to the type of the electronic device. According to various embodiments, some elements of the electronic device (for example, the electronic device 101, 201) may be omitted or other additional elements may be added. Furthermore, some of the elements may be combined with each other so as to form one entity, and the functions of the elements may be performed in the same manner as before being combined.

Figure 3:
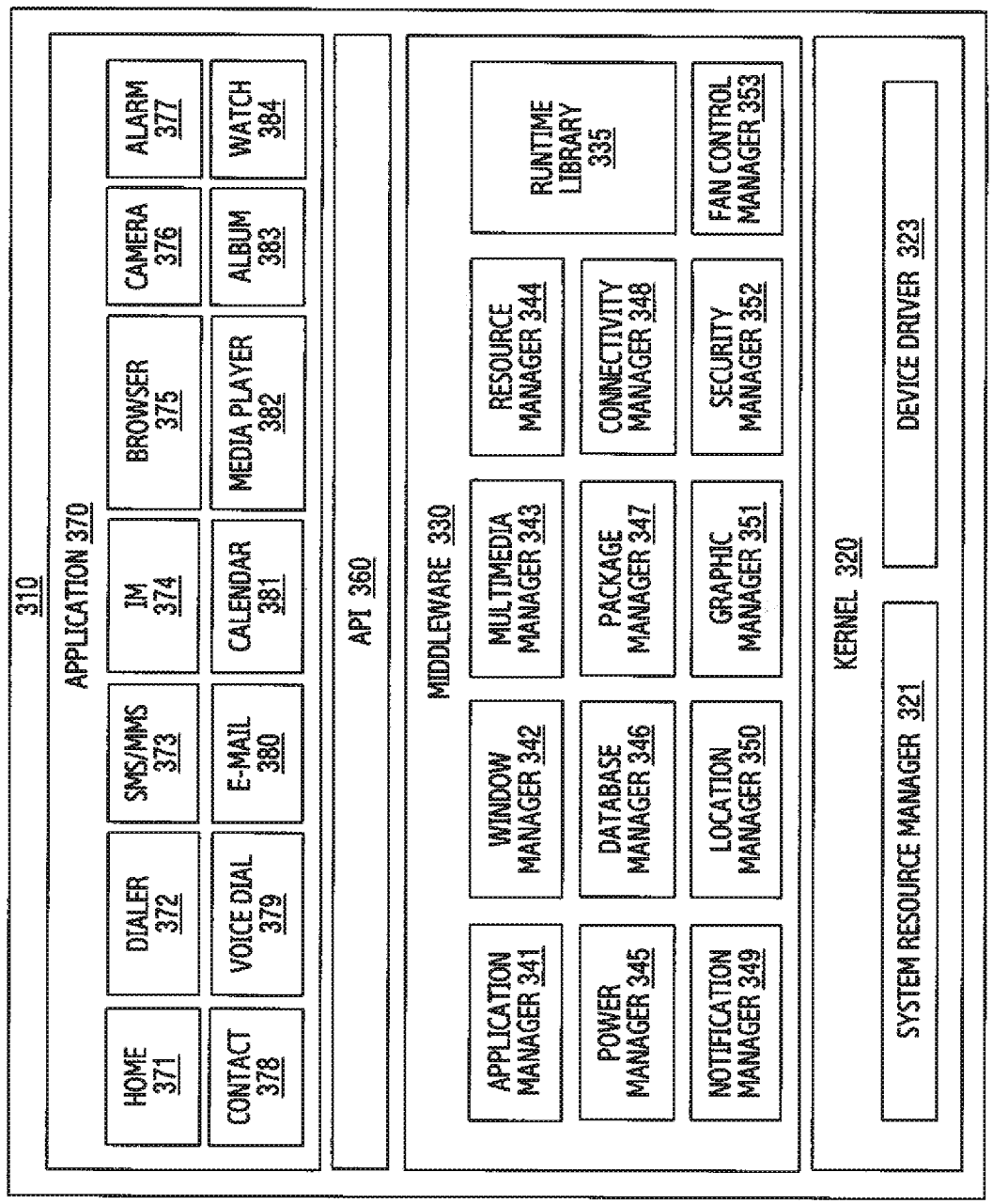
FIG. 3 is a block diagram of a program module according to various embodiments of the disclosure.

FIG. 3 is a block diagram of a program module according to various embodiments.

According to an embodiment, the program module 310 (for example, the program 140) may include an operating system to control resources of an electronic device (for example, the electronic device 101, 201), and/or various applications (for example, the application program 147) executable in the operating system. The operating system may include, for example, Android™, iOS™, Windows™, Symbian™, Tizen™, or Bada™.

Referring to FIG. 3, the program module 310 may include a kernel 320 (for example, the kernel 141), middleware 330 (for example, the middleware 143), an API 360 (for example, the API 145), and/or an application 370 (for example, the application program 147). At least part of the program module 310 may be pre-loaded on the electronic device, or may be downloaded from an external electronic device (e.g., the electronic device 102, 104 or the server 106).

The kernel 320 may include, for example, a system resource manager 321 and/or a device driver 323.

The system resource manager 321 may control, allocate or collect the system resources. According to an embodiment, the system resource manager 321 may include a process manager, a memory manager, or a file system manager.

The device driver 323 may include, for example, a display driver, a camera driver, a Bluetooth driver, a shared memory driver, a USB driver, a keypad driver, a WiFi driver, an audio driver, or an inter-process communication (IPC) driver.

The middleware 330 may provide functions which are commonly required by the application 370 or may provide various functions to the application 370 through the API 360, such that the application 370 can use limited system resources in the electronic device.

According to an embodiment, the middleware 330 may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, a security manager 352, or a fan control manager 353.

For example, the runtime library 335 may include a library module which is used by a compiler to add a new function through a programming language while the application 370 is executed. The runtime library 335 may perform input/output management, memory management, or an arithmetic function.

The application manager 341, for example, may manage the life cycle of the application 370. The window manager 342 may manage GUI resources used on a screen.

The multimedia manager 343, for example, may identify a format to be used to play media files, and may encode or decode a media file using a codec appropriate for a corresponding format. The resource manager 344 may manage the source code of the application 370 or a space of the memory.

The power manager 345, for example, may manage the capacity, temperature, or power of a battery, and determine or provide power information to be used for the operation of the electronic device based on corresponding information of the capacity, temperature, or power of the battery. According to an embodiment, the power manager 345 may interwork with a basic input/output system (BIOS).

The database manager 346, for example, may generate, search, or change a database to be used by the application 370. The package manager 347 may manage installation or update of an application that is distributed in the form of a package file. The connectivity manager 348, for example, may manage a wireless connection. The notification manager 349, for example, may provide an event such as a received message, appointment, notification of proximity to a user.

The location manager 350, for example, may manage location information of the electronic device. The graphic manager 351, for example, may manage graphic effects to be offered to a user or a user interface related to the graphic effects. The security manager 352, for example, may provide system security or user authentication.

The fan control manager 353 (or an application), for example, may transmit an electric signal related to a fan speed (or intensity) of an external device (for example, a docking station) according to temperature information (or a temperature level) of the electronic device 201. For example, the electronic device 201 and the external device may be electrically connected with each other through a first connector of the electronic device 201 and a second connector of the external device, based on the type C interface described above, and a fan operation signal (for example, a control command) of the electronic device 201 may be transmitted to the external device through the electric connection. According to various embodiments, the fan control manager 353 may detect performance of a function (or application) set in relation to a fan control of the electronic device 201 (for example, a trigger event for activating a microphone and/or a speaker). For example, the fan control manger 353 may detect a function related to the activation of the microphone, such as a call-related function or a voice recording-related function. In various embodiments, when the trigger event is detected (for example, when the function (or application) is operated), the fan control manager 353 may identify the performed function of the electronic device 201 as well as temperature information, and may transmit a signal (for example, a control command) for changing the fan operation of the external device. For example, the signal for changing the fan operation may cause the fan operation of the external device to stop (for example, a fan off control), or may cause the speed (or intensity) of the fan operation to be reduced (for example, a fan speed control).

In various embodiments, the fan control manager 353 may be included in a processor (for example, the processor 120, 210 of FIG. 1 or 2, hereinafter, referred to as the processor 210) as a hardware module or a software module.

According to an embodiment, the middleware 330 may include a telephony manager to manage a speech or video telephony function of the electronic device, or a middleware module to form a combination of the various functions of the above-described elements. According to an embodiment, the middleware 330 may provide a module which is customized according to a kind of an operating system. The middleware 330 may dynamically delete a portion of the existing elements or may add new elements.

The API 360 may be, for example, a set of API programming functions and may be provided as a different configuration according to an OS. For example, in the case of Android or iOS, one API set may be provided for each platform. In the case of Tizen, two or more API sets may be provided for each platform.

The application 370 may include, for example, an application such as home 371, dialer 372, short message service (SMS)/multimedia messaging service (MMS) 373, instant message (IM) 374, browser 375, camera 376, alarm 377, contact 378, voice dial 379, email 380, calendar 381, media player 382, album 383, watch 384, or the like. According to various embodiments, the application 370 may include a health care (for example, for measuring exercise or blood glucose), or environmental information (for example, atmospheric pressure, humidity, or temperature information) providing application. According to various embodiments, the application 370 may include an application which performs operations of determining a state of the electronic device 201 based on context awareness technology, and of adaptively controlling the fan of the external device based on the state of the electronic device 201.

According to an embodiment, the application 370 may include an information exchanging application that is capable of supporting information exchange between the electronic device 201 and the external electronic device. The information exchange application may include, for example, a notification relay application to transfer specific information to the external electronic device or a device management application to manage the external electronic device.

For example, the notification relay application may transfer notification information occurring at another application of the electronic device 201 to the external electronic device, or may receive notification information from the external electronic device and provide the notification information to a user. The device management application may install, delete, or update a function (for example, turning-on or turning-off of the external electronic device (or some components), or adjustment of brightness (or resolution) of the display) of the external electronic device communicating with the electronic device 201, or an application running on the external electronic device.

According to an embodiment, the application 370 may include an application (for example, a health care application of a mobile medical device) which is assigned in accordance with an attribute of the external electronic device.

According to an embodiment, the application 370 may include an application which is received from the external electronic device. At least part of the program module 310 may be implemented (for example, executed) by software, firmware, hardware (for example, the processor 210), or a combination of two or more thereof, and may include modules, programs, routines, sets of instructions, or processes for performing one or more functions.

The term "module" as used herein may, for example, mean a unit including one of hardware, software, and firmware or a combination of two or more of them. The "module" may be interchangeably used with, for example, the term "unit", "logic", "logical block", "component", or "circuit". The "module" may be a minimum unit of an integrated component element or a part thereof. The "module" may be a minimum unit for performing one or more functions or a part thereof. The "module" may be mechanically or electronically implemented. For example, the "module" according to the present disclosure may include at least one of an Application-Specific Integrated Circuit (ASIC) chip, a Field-Programmable Gate Arrays (FPGA), and a programmable-logic device for performing operations which has been known or are to be developed hereinafter.

According to various embodiments, at least some of the devices (for example, modules or functions thereof) or the method (for example, operations) according to the present disclosure may be implemented by a command stored in a computer-readable storage medium in a programming module form. The instruction, when executed by a processor (e.g., the processor 120), may cause the one or more processors to execute the function corresponding to the instruction. The computer-readable storage medium may be, for example, the memory 130.

The computer readable recoding medium may include a hard disk, a floppy disk, magnetic media (e.g., a magnetic tape), optical media (e.g., a Compact Disc Read Only Memory (CD-ROM) and a Digital Versatile Disc (DVD)), magneto-optical media (e.g., a floptical disk), a hardware device (e.g., a Read Only Memory (ROM), a Random Access Memory (RAM), a flash memory), and the like. In addition, the program instructions may include high class language codes, which can be executed in a computer by using an interpreter, as well as machine codes made by a compiler. The programming module according to the present disclosure may include one or more of the aforementioned components or may further include other additional components, or some of the aforementioned components may be omitted.

According to various embodiments, the recording medium may include a computer-readable recording medium having recorded thereon a program for executing the various methods described below in the processor (120, 210).

Operations executed by a module, a programming module, or other component elements according to various embodiments of the present disclosure may be executed sequentially, in parallel, repeatedly, or in a heuristic manner. Further, some operations may be executed according to another order or may be omitted, or other operations may be added.

Figure 4A:
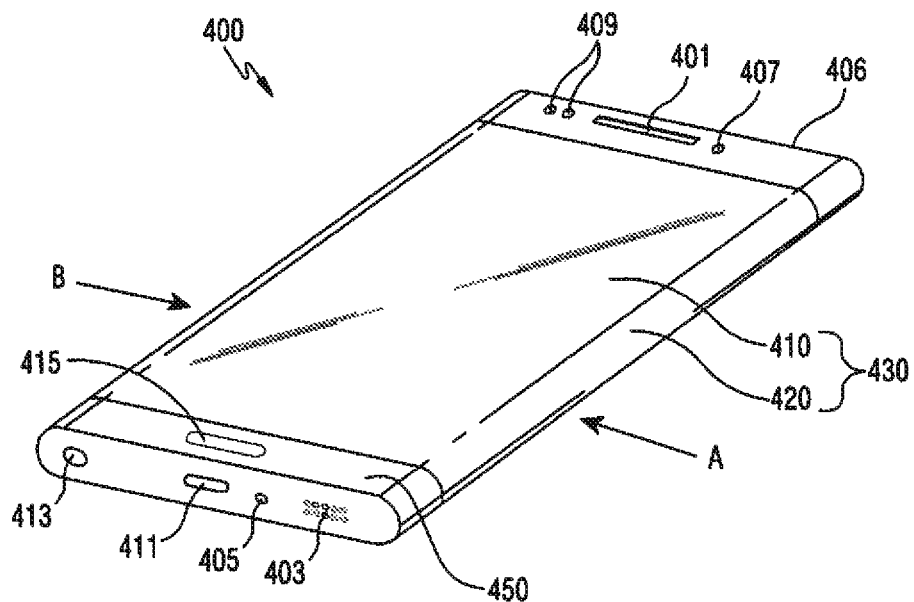
FIG. 4A is a view illustrating an example of an electronic device according to various embodiments of the disclosure.

FIG. 4A is a view illustrating an example of an electronic device according to various embodiments of the disclosure.

Referring to FIG. 4A, in various embodiments, the electronic device 400 may include a display 430, a housing (or main body) 450 in which the display 430 is seated and secured, and an additional device disposed in the housing 450 to perform a function of the electronic device 400. In various embodiments, the additional device may include a first speaker 401, a second speaker 403, a first microphone 405, a second microphone 406 (not shown), a sensor (for example, a front-facing camera 407, an illuminance sensor 409, etc.), a communication interface (for example, a charging or data input/output port 411, an audio input/output port 413, etc.), a button 415, etc.

In various embodiments, it is illustrated that the electronic device 400 is an electronic device having a curved display 430, but this should not be considered as limiting. For example, the electronic device 400 may include an electronic device having a flexible display or a flat display. The curved display 430 may be secured to the housing (or a bezel, a main body) 450, and may maintain its curved shape.

In various embodiments, the display 430 may include an active matrix screen of a specific screen size (for example, 3 inches, 4 inches, 4.65 inches, 4.8 inches, 5 inches, 6.5 inches, 7.7 inches, 8.9 inches, 10.1 inches, etc.) according to a size of the electronic device 400. In various embodiments, the display 430 may have the same or similar configuration as or to the display 160, 260 illustrated in FIG. 1 or 2.

In various embodiments, a region formed on the front surface of the display 430 may be referred to as a main region 410, and a region extended from the main region 410 and curved toward at least one side surface (for example, refer to reference signs A, B of FIG. 4A) of the housing 450, and appearing on the side surface of the housing 450 may be referred to as a sub region 420. In various embodiments, the main region 410 and the sub region 420 may be distinguished from each other for convenience of explanation, and may not be physically separated from each other.

In various embodiments, the electronic device 400 may be connected with an external device (for example, a docking station). In various embodiments, the electronic device 400 may be connected with the external device through the communication interface 411 (for example, the charging or data input/output port). In various embodiments, when the electronic device 400 is connected with the external device, the electronic device 400 may determine device information of another external device (for example, a PC, a display, an input device (for example, a keyboard, a mouse, etc.), an audio output device, etc.) connected with the external device. In various embodiments, the electronic device may determine whether another external device is connected and identify another external device, based on the device information of another external device, and may perform a process (or a task, an operation, etc.) corresponding to a user request along with another external device through the external device. For example, the electronic device 400 may operate in a charging mode, etc. along with the external device, or may operate in a PC mode, a video mode, an audio mode, or etc. along with another external device, and may process a process of transmitting data and/or a relevant command according to each mode to the external device by using the communication interface 411.

According to various embodiments, the communication interface 411 may have the same or similar configuration as or to the interface 270 illustrated in FIG. 2. For example, the communication interface 411 may be configured by using the type C interface described above. According to various embodiments, the external device may have a recess formed thereon to hold the electronic device 400 as will be described below, and the recess may include a connector (for example, a USB connector, a type C interface) to be electrically connected with the electronic device 400. The electronic device 400 may be electrically connected with a connector of the external device through the communication interface 411, and may receive power from the external device or may perform data communication with the external device.

According to various embodiments, the electronic device 400 may include a plurality of microphones (for example, the first microphone 405, the second microphone 406 (not shown)), and may receive a user's voice based on at least one of the plurality of microphones 405, 406. According to various embodiments, the electronic device 400 including the plurality of microphones 405, 406 may determine an input direction of an audio based on at least part of a time, a distance of a voice inputted to the microphones 405, 405 or an intensity (for example, a difference in decibel) of a sound (noise), and may selectively operate a microphone, accordingly. According to various embodiments, the microphones 405, 406 may include an internal microphone mounted in the electronic device 400, and an external microphone connected to the electronic device 400. According to an embodiment, when a speech recognition function is performed, speech recognition may be supported by a combination of the internal microphone and the external microphone.

According to various embodiments, the microphones 405, 406 of the electronic device 400 may be fabricated in various forms, such as in the form of one module having a plurality of small microphones arranged therein in an array form. According to an embodiment, the microphones 405, 406 may be positioned on an upper end and a lower end of the electronic device 400. According to an embodiment, the electronic device 400 may have a front surface implemented as a display region, and the plurality of microphones 405, 406 may be arranged (designed) by considering a design form and microphone performance of the electronic device 400. According to an embodiment, the first microphone 405 may be implemented to be positioned in a lower side (or a lower side of a side) of the electronic device 400 as indicated by element 405 of FIG. 4A, and the second microphone 406 may be implemented to be positioned in an upper side (or an upper side of a side) of the electronic device 400 as indicated by element 406 of FIG. 4A. In various embodiments, the arrangements of the microphones may be implemented variously according to a design of the electronic device 400.

According to various embodiments, the electronic device 400 may adaptively change a path of the microphone in response to a connection with the external device being detected. According to an embodiment, the electronic device 400 may operate the first microphone 405 (for example, a lower end microphone) provided in the lower end of the electronic device 400 in a first state (for example, a normal operation state when the electronic device is not connected with the external device). According to an embodiment, when a change from the first state to a second state (for example, a connection state with the external device) is detected, the electronic device 400 may operate the second microphone 406 (for example, an upper end microphone) provided in the upper end of the electronic device 400 based on the second state. For example, the electronic device 400 may change the microphone path from the first microphone 405 to the second microphone 406 in response to the change of the state of the electronic device 400. According to an embodiment, when the electronic device 400 is connected with the external device, the electronic device 400 may change the transmission and reception path of the microphone to a microphone that is less influenced by the external device (for example, is less influenced by a noise caused by a fan operation of the external device).

According to various embodiments, when the electronic device 400 is connected with the external device, an audio signal may be weakly inputted to the first microphone 405 since the first microphone 405 of the electronic device 400 may be hidden (or surrounded) by the housing of the external device. For example, when the electronic device 400 is connected with the external device and performs a function (or an application) that is required to use the microphone to input an audio, such as a call or speech recognition, it may be difficult to operate the lower end microphone (for example, the first microphone 405). Therefore, the electronic device 400 may change the connection path of the microphone (for example, may turn off the lower end microphone and turn on the upper end microphone). For example, in various embodiments, when the electronic device 40 is connected with the external device, the microphone path may be set to be automatically changed to the second microphone 406 by the electronic device 400.

According to an embodiment, in a speaker mode or a speech recognition mode (for example, a state in which a corresponding function is performed when the electronic device 400 is not connected with the external device), the electronic device 400 may operate at least one of the first microphone 405 (for example, the lower end microphone) according to setting of the electronic device 400.

Figure 4B:
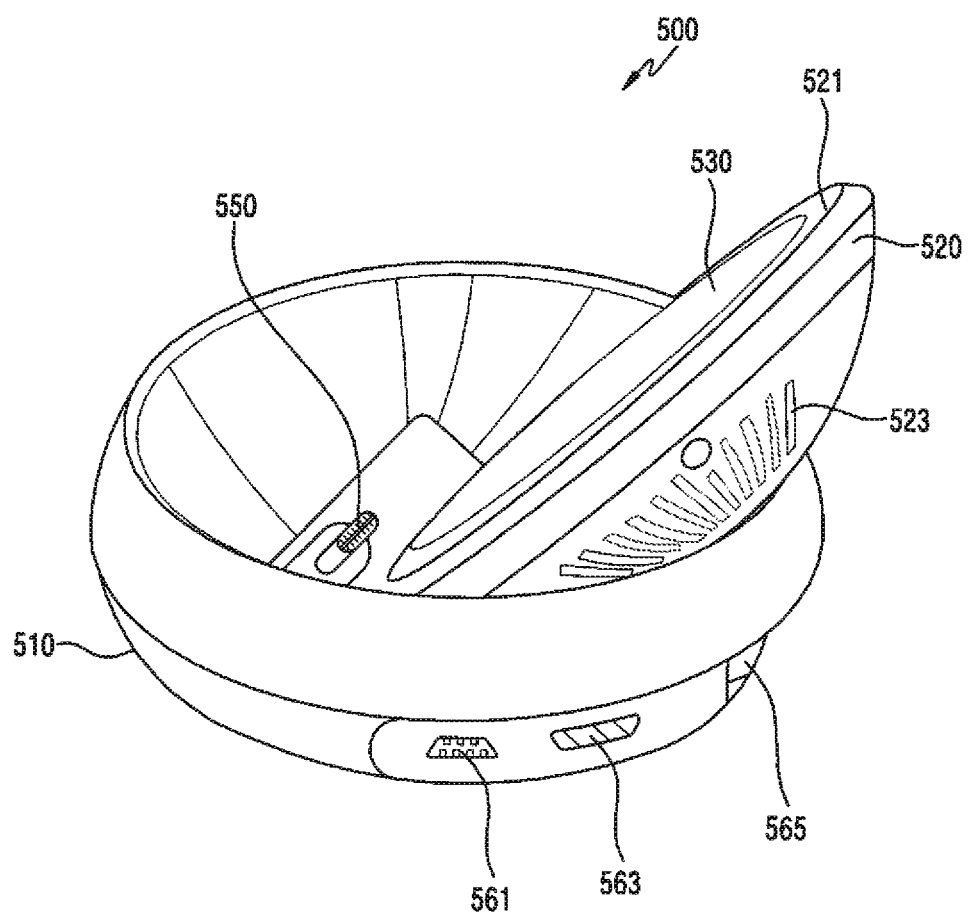
FIG. 4B is a view illustrating an example of an external device according to various embodiments of the disclosure.

FIG. 4B is a view illustrating an example of an external device according to various embodiments of the disclosure.

Referring to FIG. 4B, in various embodiments, the external device 500 (for example, a docking station) may include a housing (or a main body) 510. According to an embodiment, the external device 500 may have a recess formed therein to allow the electronic device 400 to be held through the housing 510 (or a first housing), and may include a holding member 520 (or a second housing) to hold the electronic device 400 by a predetermined slope from the recess. In various embodiments, the holding member 520 may include a holding pad 530 to allow the electronic device 400 to be seated thereon in a leaning form, and a fan (not shown) (internal component) disposed in the holding member 520 to generate air to reduce heat emission of the electronic device 400. According to various embodiments, the holding member 520 may include an exhaust air hole 521 (or an air discharge hole) formed a front surface thereof (for example, a border region of the holding pad 530) to discharge (deliver) the air of the fan (for example, exhaust air) to the electronic device 400. The holding member 520 may include an intake air hole 523 formed on a rear surface thereof to draw in external air to be able to generate air by the fan.

According to various embodiments, the external device 500 may include the first housing (for example, the housing 510), and the second housing (for example, the holding member 520), and the first housing and the second housing may be secured to each other by mechanical securing members thereof. The first housing may serve as a support of the second housing and may have the recess for insertion and electrical connection of the electronic device 400, and the second housing may be supported on the first housing and may mechanically slide and may be inserted into the recess of the first housing, or may slide in the reverse operation to the insertion operation, may protrude, and may be erected to have a predetermined slope with respect to the first housing. The second housing may form a plane when being inserted into the recess of the first housing, such that the electronic device 400 can be held while lying on the second housing, and, when the second housing protrudes from the recess of the first housing, the electronic device 400 can be held while being erected by a specific slope.

According to various embodiments, the external device 500 may include a communication interface and a power interface in the housing 510. The external device 500 may further include at least a part of a control circuit (for example, a processor) (not shown), a battery (not shown), a wireless communication circuit (for example, a communication circuit for short range wireless communication), or a memory (not shown) according to a role (or function) of the external device. According to an embodiment, the external device 500 may be a docking station and/or a charging device.

In various embodiments, the communication interface may include a first communication interface 550 for electrical connection (or wired connection) with the electronic device 400, and a second communication interface 561, 563, for electrical connection (or wired connection) with another external device (for example, a display, a keyboard, a mouse, a speaker, etc.).

According to various embodiments, the first communication interface 550 may have the same or similar configuration as or to the interface 270 illustrated in FIG. 2. For example, the first communication interface 550 may be configured by a type C interface described above. According to various embodiments, the second communication interface 561, 563 may include at least one interface for connection with another external device, such as an HDMI, a USB, an optical interface, a digital visual interface (DVI), a display port (DP), or D-sub, and an interface (for example, a LAN interface) for Internet communication.

According to various embodiments, the power interface 565 may be an interface which receives from an external power source, and supplies power to the electronic device 400. According to various embodiments, the power interface 565 may be electrically connected with the first communication interface 550 [[510]] to transmit the power to the electronic device 400.

In various embodiments, the external device 500 may be electrically connected with the electronic device 400 by using the first communication interface [[510]] 550. According to an embodiment, the external device 500 may receive data related to a fan control of the external device 500 from the electronic device 400, may supply power to the electronic device 400, may receive data related to another external device (not shown) from the electronic device 400, or may transmit data inputted from another external device (not shown) to the electronic device 400 by using the first communication interface [[510]] 550.

According to various embodiments, the external device 500 may include at least one battery, and may include a charging circuity for charging the electronic device 400 although they are not illustrated. According to an embodiment, the external device 500 may include a coil for wirelessly charging.

According to various embodiments, when direct current (DC) power is supplied from a power supply device (not shown) (for example, a travel adaptor (TA) or a power supply), the external device 500 may convert the DC power into alternating current (AC) power, and may transmit the power to the electronic device 400 through an electric circuit (for example, an electric circuit between the power interface and the first communication interface, and/or a transmission coil for wirelessly charging, etc.). In various embodiments, the power supply device may be included in the external device 500 as an integral device, or may be implemented as a separate device (for example, a charger).

According to various embodiments, the external device 500 may supply a corresponding charging power to the electronic device 400 in response to a request for a first charging power, a second charging power greater than the first charging power, or a third charging power greater than the second charging power being received through communication with the electronic device 400.

According to various embodiments, another external device (not shown) may include various devices that are connected with the external device 500 in at least one communication method of a wired method or a wireless method, and receive data transmitted by the electronic device 400 from the external device 500 and output the data. For example, another external device may be various devices that can output data such as a display device (for example, a monitor, a VR device) and an audio output device. Another external device according to various embodiments may be wiredly or wirelessly connected with a peripheral device (for example, a mouse, a keyboard, etc.).

Figure 5B:
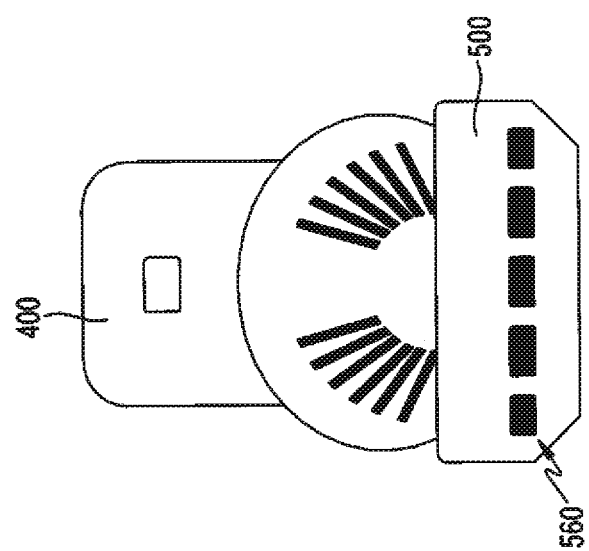
FIGS. 5A and 5B illustrate a connection state of the electronic device and the external device according to various embodiments of the disclosure.
Figure 5A:
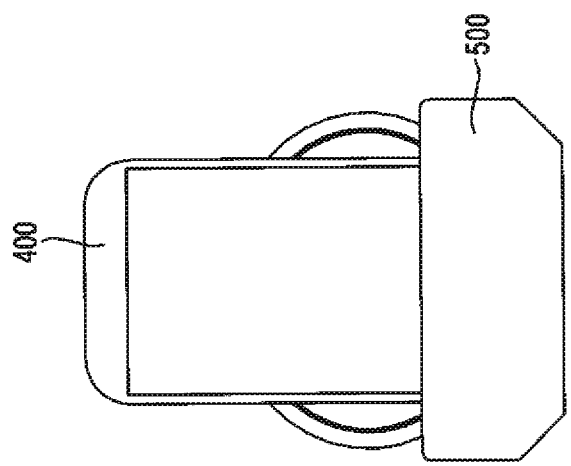

FIGS. 5A and 5B illustrate a connection state between the electronic device and the external device according to various embodiments of the disclosure.

As shown in FIGS. 5A and 5B, a state in which the electronic device 400 is seated on the external device 500, and FIG. 5A of FIG. 5 illustrates a front view, and FIG. 5B illustrates a rear view.

As shown in FIGS. 5A and 5B, the external device 500 may discharge exhaust air through an exhaust air hole (or air discharge hole) (for example, 521 of FIG. 4B) formed on the surface of the holding pad 530 contacting the electronic device 400. For example, the exhaust air may be transferred to the front surface and the rear surface of the electronic device 400. According to various embodiments, the external device 500 may draw in external air (for example, intake air) through an intake air hole (or an air suction port) (for example, 523 of FIG. 4B) formed on the rear surface of the external device 500 to draw in external air, and may discharge the drawn-in external air to the electronic device 400 as exhaust air by rotating the fan.

The external device 500 may include a plurality of interfaces (for example, a communication interface or a communication port) for connection with another external device (for example, a display, a keyboard, a mouse, a speaker, etc.) through any side surface (for example, at least one of a front surface, a side surface, a rear surface) of the housing, an interface (for example, a power interface) for supplying power, an interface (for example, a LAN port) for internet communication, as indicated by element 560 in FIG. 5B.

According to various embodiments, the electronic device 400 may be seated on the external device 500 (for example, a docking station) and may be electrically connected with the external device 500 through the communication interface. According to various embodiments, the communication interface of the electronic device 400 and the external device 500 may include a type C interface. According to various embodiments, the electronic device 400 and the external device 500 may be coupled to each other through a first connector of the electronic device 400 and a second connector of the external device 500, based on the type C interface, and may be electrically connected with each other, and a fan operation signal (for example, a control command) of the electronic device 400 may be transmitted to the external device 500 through electric connection. According to an embodiment, the electronic device 400 may transmit data related to the fan control of the external device 500 to the external device 500 by using the communication interface, or may transmit data related to another external device (for example, a display, an external speaker, or the like) connected to the external device 500 to the external device 500.

According to various embodiments, when the electronic device 400 is connected with the external device 500, the electronic device 400 may determine device information of another external device connected to the external device 500. In various embodiments, the electronic device 400 may identify another external device based on the device information of another external device, and may perform a process (or a task, an operation, etc.) corresponding to another external device 600 and a user request through the external device 500. For example, the electronic device 400 may operate in a charging mode, a PC mode, a video mode, or an audio mode along with another external device, and may process a process of transmitting data according to each mode to the docking station 500 by using first wireless communication.

According to various embodiments, the external device 500 may receive data from the electronic device 400 by using the communication interface, and may transfer the received data to another external device by using another communication (for example, wired communication (for example, an HDMI), wireless communication (for example, WiFi)) connected with the external device 500. Another external device may receive data from the external device 500 by using another communication, and may process data output (for example, video output, audio output, etc.) corresponding to another external device 600.

According to various embodiments, when the electronic device 400 is connected with the external device 500, the electronic device 400 may determine a state of the electronic device 400 based on various context awareness technologies, and may adaptively control the fan of the external device 500 based on the state of the electronic device 400. According to an embodiment, when the electronic device 400 is connected with the external device 500, the electronic device 400 may control charging of the electronic device 400 based on a charging power supplied from the external device 500, and may perform control related to the fan control of the external device 500 based on the charging power. According to an embodiment, the electronic device 400 may analyze the state of the electronic device in response to a connection with the external device 500 being detected, and may perform control related to the fan control of the external device 500 based on a result of the analysis.

According to various embodiments, the electronic device 400 may process an operation related to controlling a microphone path of the electronic device 400 (for example, turning off the lower end microphone and turning on the upper end microphone) in response to the connection with the external device 500 being detected.

According to various embodiments, in the state in which the electronic device 400 is connected with the external device 500, the electronic device 400 may transmit, to the external device 500, a control command related to holding, stopping or changing the fan operation of the external device 500 based on various states of the electronic device 400. According to various embodiments, the external device 500 may hold, stop, or change the fan operation based on the control command of the electronic device 400. According to various embodiments, the electronic device 400 controlling the fan operation of the external device 500 based on the state of the electronic device 400 will be described in detail with reference to the drawings, which will be described below.

According to various embodiments, the electronic device 400 may be charged (for example, charged wiredly or wirelessly) by interworking with the external device 500. For example, the electronic device 400 may perform a charging operation based on a voltage supplied from the external device 500 when the electronic device 400 is connected with or seated on the external device 500. According to an embodiment, the electronic device 400 may receive, through an electric circuit, power transmitted from the external device 500 through an electric circuit, and may charge an internal battery based on the received power.

According to various embodiments, the electronic device 400 may exchange information (for example, power information) related to the charging power (for example, a charging voltage and a charging current) with the external device 500 by using communication. For example, the electronic device 400 and the external device 500 may perform communication for exchanging information through their respective electric circuits. Alternatively, the electronic device 400 and the external device 500 may perform communication for exchanging information through wireless communication (for example, BLE, Zigbee, NFC, etc.).

According to various embodiments, the electronic device 400 may selectively receive at least one charging power from the plurality of charging powers from the external device 500. The electronic device 400 may process battery charging by using the selected at least one charging power. According to an embodiment, the electronic device 400 may receive a first charging power (for example, a normal charging power) from the external device [[400,]] 500, and may perform charging in response to the received first charging power. According to an embodiment, the electronic device 400 may receive a second charging power (for example, a quick charging power) greater than the first charging power used for normal charging from the external device 500, and may perform charging in response to the received second charging power.

According to various embodiments, the electronic device 400 and the external device 500 may be configured to include a wireless charging circuit (for example, a coil) to provide wireless charging of the electronic device 400. For example, the electronic device 400 may receive power from the external device 500 wirelessly.

According to various embodiments, the external device 500 may be connected with at least one other external device wiredly or wirelessly. The external device 500 may forward data transmitted and received between the electronic device 400 and at least one other external device. According to an embodiment, the external device 500 may be connected with the electronic device 400 through the communication interface, and may receive data (for example, a video, an audio, etc.) transmitted from the electronic device 400 and may forward the received data through communication connected with the external device 600.

As described above, the electronic device (for example, the electronic device 101, 201, 400 of FIG. 1, FIG. 2, or FIG. 4A) according to various embodiments may include: the interface 270 configured to connect with the external device 500; and the processor 210 electrically connected with the interface 270, and the processor 270 may be configured to: detect a connection with the external device 500 by using the interface 270; determine a state of the electronic device 400 based at least on the detection of the connection with the external device 500; and transmit a command (control signal) related to a control of a fan operation of the external device 500 to the external device 500 by using the interface 270, based at least on the state of the electronic device 400.

According to various embodiments, the processor may be configured to: receive a charging power of the external device by using the interface; determine a state of the electronic device based on the charging power; generate a command for controlling the fan operation of the external device based at least on the determined state of the electronic device; and transmit the command to the external device by using the interface.

According to various embodiments, the processor may be configured to: determine the state of the electronic device when the electronic device is connected with the external device; when the state of the electronic device is a state for changing the fan operation, generate a command related to the state of the electronic device; and transmit the command to the external device by using the interface.

According to various embodiments, the processor may be configured to determine a temperature of the electronic device, and to generate the command based at least on the temperature of the electronic device.

According to various embodiments, the processor may be configured to determine a performed function of the electronic device, and to generate the command based on a type of the performed function of the electronic device According to various embodiments, the processor may be configured to: determine a performed function of the electronic device; and, when the performed function of the electronic device is a function that is set to use a microphone or a speaker of the electronic device, generate a command to turn off the fan or to control an operation speed of the fan.

According to various embodiments, the processor may be configured to: when the performed function is a first function that uses the microphone, generate a first command to stop the operation of the fan regardless of a temperature of the electronic device; and, when the performed function is a second function that uses the microphone or the speaker, generate a second command to change the operation of the fan based on the temperature of the electronic device.

According to various embodiments, the processor may be configured to change a microphone path of the electronic device based at least on the detection of the connection with the external device.

According to various embodiments, the electronic device may further include a display, and the processor may be configured to: monitor a state of the fan or a state of the electronic device according to a control of the fan of the external device; generate state information based on a result of the monitoring; and output the state information by using the display.

According to various embodiments, the processor may be configured to display the state information differently based on an operation state of the display.

According to various embodiments, the processor may be configured to: identify an operation mode of the electronic device based on a state of the electronic device; when the identified operation mode is a first operation mode, transmit, to the external device by using the interface, a first control signal to control an operation speed of the fan of the external device in a first method corresponding to the first operation mode; and, when the identified operation mode is a second operation mode, transmit, to the external device by using the interface, a second control signal to control the operation speed of the fan of the external device in a second method corresponding to the second operation mode.

According to various embodiments, the electronic device may further include: one or more microphones; and one or more speakers, and the processor may be configured to: when the electronic device is set to use the one or more microphones or the one or more speakers, identify the operation mode of the electronic device as the first operation mode, and, when the electronic device is set not to use the one or more microphones or the one or more speakers, identify the operation mode of the electronic device as the second operation mode.

According to various embodiments, the processor may be configured to control one or more operations of the one or more microphones or the one or more speakers in the first method or the second method.

As described above, the electronic device (for example, the electronic device 101, 201, 400 of FIG. 1, FIG. 2, or FIG. 4A) according to various embodiments may include: the interface 270 configured to electrically connect with the external device 500; the one or more microphones (for example, the microphone 288 of FIG. 2, the microphones 405, 406 of FIG. 4A), and the processor 210, and the processor 210 may be configured to: identify an operation mode of the electronic device; when the identified operation mode is the first operation mode, transmit, to the external device by using the interface, the first control signal to control an operation speed of the fan of the external device in the first method corresponding to the first operation mode; and, when the identified operation mode is the second operation mode, transmit, to the external device by using the interface, the second control signal to control the operation speed of the fan of the external device in the second method corresponding to the second operation mode.

According to various embodiments, the electronic device may include the one or more speakers, and the processor may be configured to: if the operation mode corresponds to a function that is set to use the one or more microphones or the one or more speakers, cause the electronic device to operate in the first operation mode, and, if the operation mode corresponds to a function that is set not to use the one or more microphones or the one or more speakers, cause the electronic device to operate in the second operation mode.

According to various embodiments, the processor may be configured to control one or more operations of the one or more microphones or the one or more speakers in the first method or the second method.

Figure 6:
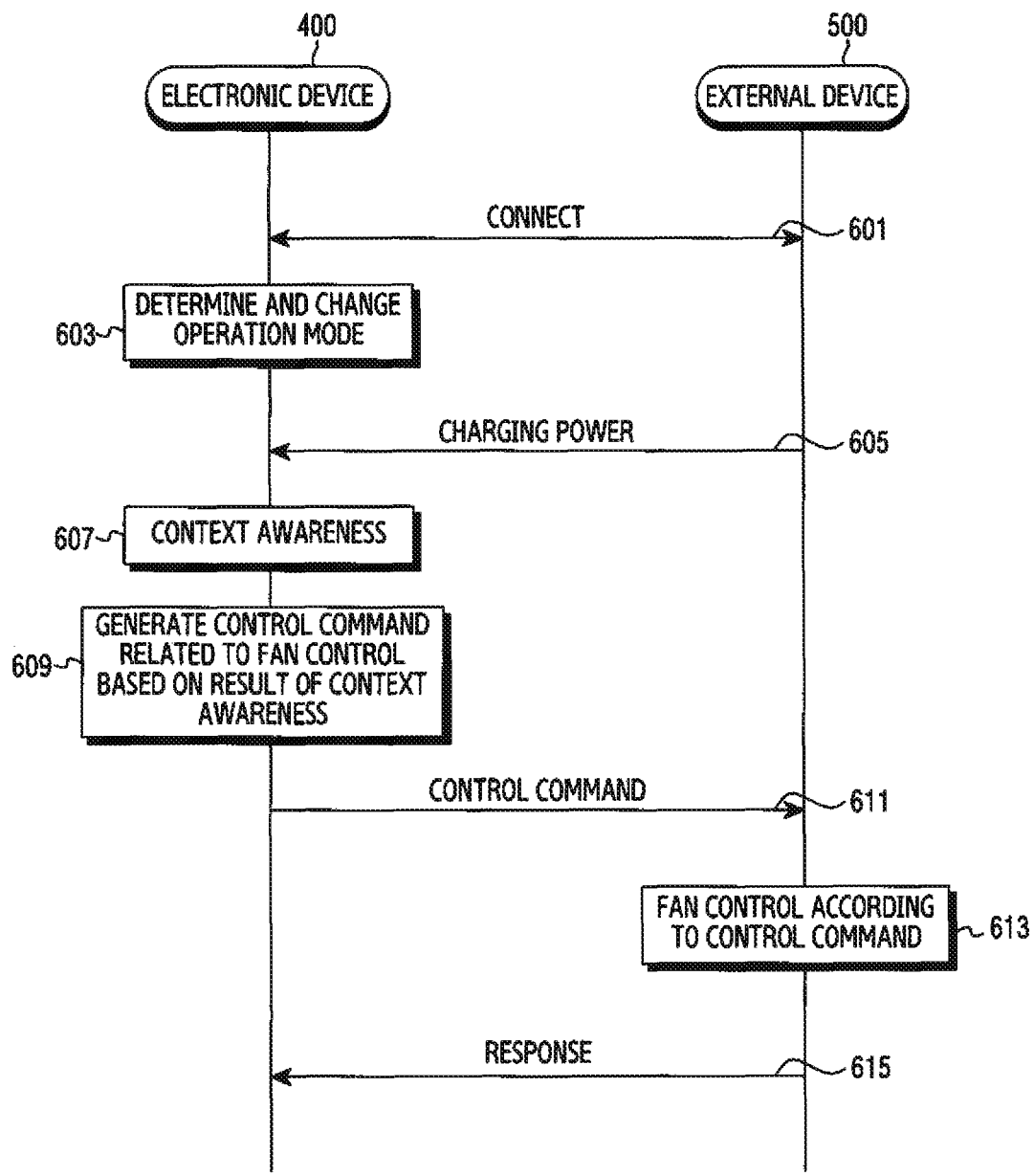
FIG. 6 is a view illustrating a fan control operation between the electronic device and the external device according to various embodiments of the disclosure.

FIG. 6 is a view illustrating a fan control operation between the electronic device and the external device according to various embodiments of the disclosure.

Referring to FIG. 6, in operation 601, the electronic device 400 and the external device 500 may be connected with each other. According to an embodiment, the external device 500 may have a recess formed thereon to hold the electronic device 400, and the recess may include a connector (for example, a type C interface (or connector)) for electrical connection with the electronic device 400. The electronic device 400 and the external device 500 may be electrically connected with each other through the connector.

In operation 603, the electronic device 400 may determine and change an operation mode of the electronic device 400 in response to the connection with the external device 500 being detected. According to an embodiment, the electronic device 400 may include a plurality of microphones, and the plurality of microphones may be provided on an upper end and a lower end of the electronic device 400, for example. When the electronic device 400 is connected with the external device 500, the electronic device may determine states of the microphones, and, when the microphone is set to a path of the lower end microphone, the electronic device 400 may be set to change the path of the microphone to the upper end microphone. For example, when the electronic device 400 is connected with the external device 500 as in the examples of FIGS. 5A and 5B described above, the lower end microphone of the electronic device 400 may be surrounded by the recess of the external device 500. Accordingly, when the electronic device 400 performs a function (or an application) such as a call or speech recognition, a voice may be weakly inputted to the lower end microphone or may not be inputted. Accordingly, in various embodiments, when the electronic device 400 and the external device 500 are connected with each other, the electronic device 400 may be set to change the microphone used therein (for example, to turn off the lower end microphone and turn on the upper end microphone).

In operation 605, the external device 500 may supply a charging power to the electronic device 400 in response to the connection of the electronic device 400 being detected. According to an embodiment, the electronic device 400 and the external device 500 may be electrically connected with each other based on the communication interface (for example, the type C interface), and the external device 500 may supply the charging power to the electronic device 400 through the communication interface, and the electronic device 400 may receive the charging power supplied from the external device 500 through the communication interface.

In various embodiments, the order of operations 603 and 605 are just for convenience of explanation and better understanding, and is not limited to the above-described order. For example, operations 603 and 605 may be performed in reverse order, that is, operation 603 may be performed after operation 605, or operations 603 and 605 may be performed in parallel.

In operation 607, the electronic device 400 may perform context awareness. According to an embodiment, the electronic device 400 may perform context awareness regarding at least part of the charging power supplied from the external device 500, a function (or an application) performed by the electronic device 400, or temperature of the electronic device 400. For example, the electronic device 400 may determine a state of the electronic device 400 by monitoring (or tracking, sensing) a variety of context information including dynamic, individual, static contexts occurring in the electronic device 400 and an ambient environment.

In operation 609, the electronic device 400 may generate a control command related to a fan control of the external device 500, based on a result of the contest awareness. According to an embodiment, based on a result of the context awareness, the electronic device 400 may generate a first control command (for example, turning on a fan operation) in response to a first state of the electronic device 400, generate a second control command (for example, turning off the fan operation) in response to a second state, or generate a third control command (for example, changing a speed (or intensity) of the fan operation) in response a third state when determining the third state. According to various embodiments, regarding the first command, the electronic device 400 may generate another control command to control the fan to operate based on a first speed, a second speed, or a third speed according to a state of the electronic device 400. For example, in various embodiments, the electronic device 400 may provide various control commands in response to various states of the electronic device 400.

In operation 611, the electronic device 400 may transmit the control command to the external device 500. According to an embodiment, the electronic device 400 may transmit the control command to control the fan of the external device 500 to the external device 500 through the communication interface connected with the external device 500. According to an embodiment, when the electronic device 400 receives power from the external device 500, heat may be generated in the electronic device 400 due to a charging operation. In addition, when the electronic device 400 performs an application while being connected with the external device 500, more heat may be generated than when only charging is performed. Temperature of the electronic device 400 may increase due to the generation of the heat, and in various embodiments, the fan of the external device 500 may be controlled to reduce the temperature of the electronic device 400.

In operation 613, when the external device 500 receives the control command from the electronic device 400, the external device 500 may control the fan according to the received control command. According to an embodiment, the external device 500 may drive the fan operation, turn off the fan operation, or change the speed of the fan operation according to the control command.

In operation 615, the external device 500 may transmit a response (for example, ACK) to the fan control to the electronic device 400. In various embodiments, operation 615 may not be performed. For example, since the operation of the fan of the external device 500 may be determined according to the control command of the electronic device 400, the external device 500 may control the fan according to the received control command, and may not transmit a separate response.

According to various embodiments, when the electronic device 400 is connected with the external device 500, the electronic device 400 may control the fan of the external device 500 to be driven at the time when detecting an initial connection, regardless of the charging power of the external device 500. According to an embodiment, in response to the connection with the external device 500 being detected, the electronic device 400 may directly transmit the control command to drive the fan of the external device 500, and then, may perform an additional control (for example, holding, stopping, or changing) regarding the fan based on a charging power.

Figure 7A:
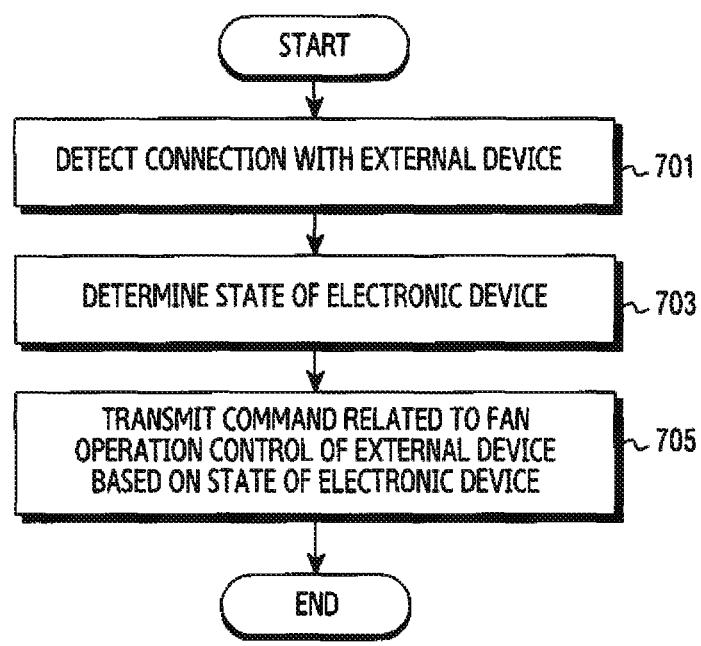
FIG. 7A is a flowchart illustrating an operating method of an electronic device according to various embodiments of the disclosure.

FIG. 7A is a flowchart illustrating an operating method of an electronic device according to various embodiments of the disclosure.

Referring to FIG. 7A, in various embodiments, FIG. 7A illustrates that, when an electronic device and an external device are connected with each other, a fan of the external device is controlled based on a state of the electronic device.

In operation 701, a processor (for example, one or more processors including a processing circuitry) (for example, the processor 120, 210 of FIG. 1 or 2, hereinafter, referred to as the processor 210) of the electronic device (for example, the electronic device 101, 201, 400 of FIG. 1, FIG. 2, or FIG. 4A) may detect a connection between the electronic device and the external device (for example, a docking station). According to an embodiment, the processor 210 may detect the connection with the external device through an interface which is set for connection with the external device (for example, the interface 270 of FIG. 2, a USB, a type C interface). For example, the processor 210 may recognize the connection with the external device through configuration channels (CC) of the communication interface.

In operation 703, the processor 210 may determine a state of the electronic device. According to an embodiment, the processor 210 may determine the state of the electronic device by using various context awareness technologies, based at least on the detection of the connection with the external device. For example, the processor 210 may recognize various states of the electronic device (for example, temperature, ambient temperature, a charging state, a state of a performed function (or application), a state of occurrence of a trigger event to use a microphone and/or speaker), based at least in part on a sensor value measured by at least one sensor.

In operation 705, the processor 210 may transmit a command related to a fan operation control of the external device to the external device, based at least on the state of the electronic device. According to an embodiment, the processor 210 may determine to turn off the fan operation of the external device when it is determined that a call function of the electronic device is performed. According to an embodiment, when it is determined that a speech recognition function is performed, the processor 210 may determine to reduce a speed (or intensity) (for example, Rpm) of the fan operation of the external device, or to turn off the fan operation, based on a heat emission state of the electronic device 400. According to an embodiment, the processor 210 may determine to increase the speed (or intensity) of the fan operation of the external device according to a heat emission state (or temperature) of the electronic device. According to an embodiment, the processor 210 may determine to hold the fan operation, to change the speed, or to turn off the fan operation, based on a heat emission state and an ongoing function of the electronic device. According to various embodiments, the processor 210 may transmit a control command (for example, a command to drive, hold, change, or turn off the fan operation of the external device) corresponding to the determination to the external device by using the interface connected with the external device.

Figure 7B:
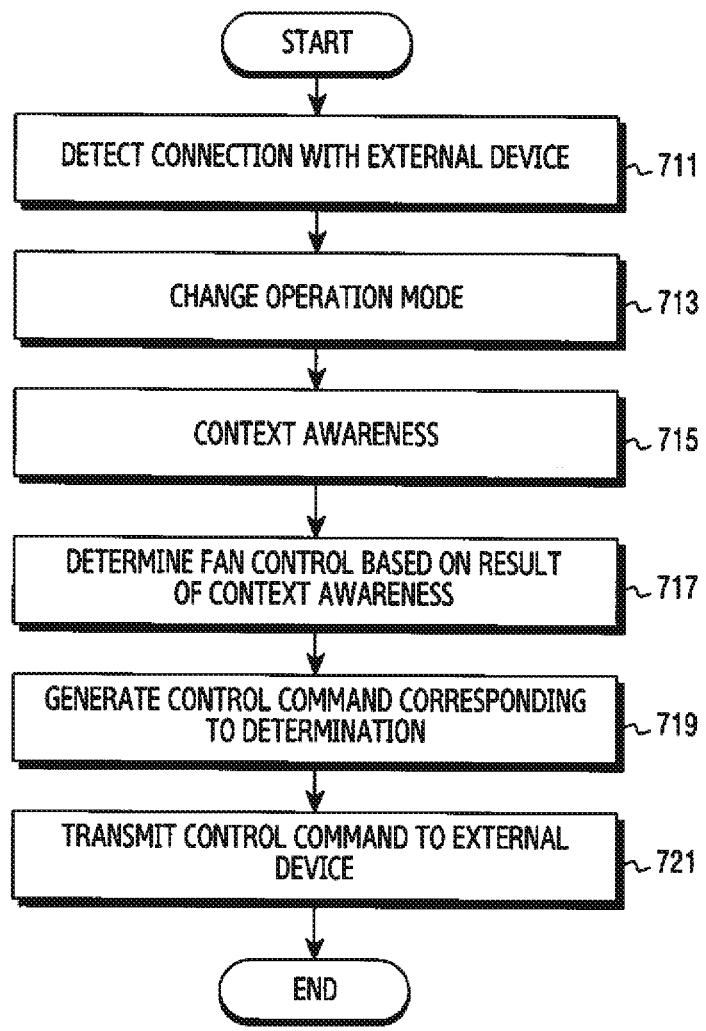
FIG. 7B is a flowchart illustrating an operating method of an electronic device according to various embodiments of the disclosure.

FIG. 7B is a flowchart illustrating an operating method of an electronic device according to various embodiments of the disclosure.

Referring to FIG. 7B, in various embodiments, FIG. 7B illustrates that, when an electronic device and an external device are connected with each other, a fan of the external device is controlled based on context awareness by the electronic device.

In operation 711, a processor (for example, one or more processors including a processing circuitry) (for example, the processor 120, 210 of FIG. 1 or 2, hereinafter, referred to as the processor 210) of the electronic device (for example, the electronic device 101, 201, 400 of FIG. 1, FIG. 2, or FIG. 4A) may detect a connection between the electronic device and the external device (for example, a docking station). According to an embodiment, the processor 210 may detect the connection with the external device through an interface (for example, the interface 270 of FIG. 2, a USB, a type C interface). For example, the processor 210 may recognize the connection with the external device through configuration channels (CC) of the communication interface.

In operation 713, the processor 210 may change an operation mode in response to the connection with the external device being detected. According to an embodiment, the processor 210 may change a microphone path which is set to a lower end microphone (for example, a first microphone) as default to be set to an upper end microphone (for example, a second microphone). According to an embodiment, the processor 210 may set the microphone path to allow both the lower end microphone and the upper end microphone to operate according to an ongoing application in the electronic device. According to various embodiments, when the electronic device is connected with the external device, the processor 210 may change the operation mode to allow the upper end microphone exposed to the outside to be used while being docked into the external device.

In operation 715, the processor 210 may determine context awareness. According to an embodiment, the processor 210 may determine a state of the electronic device based on various context awareness technologies, in response to the connection with the external device being detected. For example, the processor 210 may recognize various states of the electronic device (for example, temperature, ambient temperature, a charging state, a state of a performed function (or application), a state of occurrence of a trigger event to use a microphone and/or speaker), based at least in part on a sensor value measured by at least one sensor.

In operation 717, the processor 210 may determine whether to control the fan of the external device, based on a result of the context awareness. According to an embodiment, the processor 210 may determine to turn off the fan operation of the external device when it is determined that a call function of the electronic device is performed. According to an embodiment, when it is determined that a speech recognition function is performed, the processor 210 may determine to reduce a speed (or intensity) (for example, Rpm) of the fan operation of the external device, or to turn off the fan operation, based on a heat emission state of the electronic device 400. According to an embodiment, the processor 210 may determine to increase the speed (or intensity) of the fan operation of the external device according to a heat emission state (or temperature) of the electronic device. According to an embodiment, the processor 210 may determine to hold the fan operation, to change the speed, or to turn off the fan operation, based on a heat emission state and an ongoing function of the electronic device.

In operation 719, the processor 210 may generate a control command corresponding to the determination. According to an embodiment, the processor 210 may generate the control command corresponding to driving, holding, changing, or turning off the fan operation of the external device. According to various embodiments, the processor 210 may manage control commands for respective states of the electronic device in the form of a lookup table, and may generate a control command based on the lookup table.

In operation 721, the processor 210 may transmit the control command to the external device. According to an embodiment, the processor 210 may transmit the control command to the external device by using the interface connected with the external device. According to an embodiment, when the external device supports wireless communication such as short-range communication, the processor 210 may transmit the control command to the external device through wireless communication by using a communication module.

Figure 8:
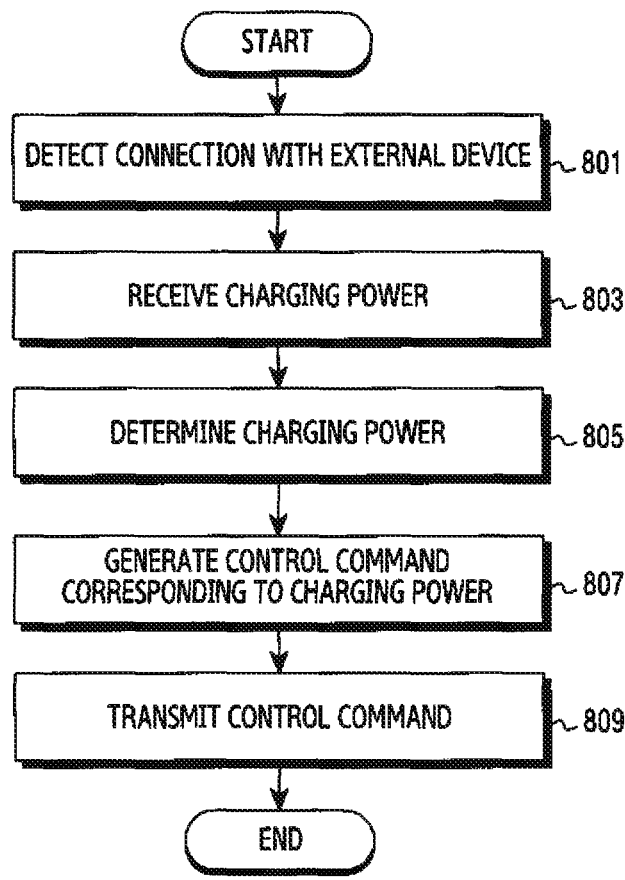
FIG. 8 is a flowchart illustrating an operating method of the electronic device according to various embodiments of the disclosure.

FIG. 8 is a flowchart illustrating an operating method of the electronic device according to various embodiments of the disclosure.

Referring to FIG. 8, in various embodiments, FIG. 8 illustrates that, when the electronic device and the external device are connected with each other, the fan of the external device is controlled based on a charging power supplied by the external device.

In operation 801, the processor 210 of the electronic device may detect a connection between the electronic device and the external device (for example, a docking station). According to an embodiment, the processor 210 may be electrically connected through an interface (for example, the interface 270 of FIG. 2, a type C interface) set for connection between the electronic device and the external device.

In operation 803, in response to the connection with the external device, the processor 210 may receive a charging power from the external device. According to an embodiment, when the external device is supplied with DC or AC power from a power supply device (for example, a travel adaptor (TA) or a power supply), the external device may convert the power into DC power to supply to the electronic device, and may supply the power to the electronic device through an electric circuit (for example, an electric circuit between a power interface and the type C interface).

According to various embodiments, the external device may transmit the power to the electronic device in various modes. According to an embodiment, the external device may supply power to the electronic device in a mode according to rated output (nominal power) 15W (for example, Nominal Input Voltage (9.0V)×Nominal Input Current (1670 mA)), rated output 18W (for example, Nominal Input Voltage (9.0V)×Nominal Input Current (2000 mA)), or rated output 25W (for example, Nominal Input Voltage (12.0V)×Nominal Input Current (2100 mA)).

In operation 805, the processor 210 may determine the charging power from the external device. According to an embodiment, the processor 210 may determine whether the charging power supplied from the external device corresponds to a first charging power (for example, 15W), a second charging power (for example, 18W), or a third charging power (25W). According to various embodiments, the processor 210 may exchange information (for example, power information) related to the charging power (for example, a charging voltage or a charging current) with the external device by using communication, and may recognize the charging power based on information exchange. For example, the electronic device and the external device may perform communication for transmitting and receiving information through their respective electric circuits (for example, an interface set for connection between the electronic device and the external device).

In operation 807, the processor 210 may generate a control command in response to the charging power. According to an embodiment, the processor 210 may generate a first control command based on determination of the first charging power, generate a second control command based on determination of the second charging power, or generate a third control command based on determination of the third charging power. For example, when charging is performed with 25W, more heat may be generated in the electronic device (for example, temperature of the electronic device increases) than when charging is performed with 15W, and the processor 210 may set a fan control of the external device differently based on the charging power.

In operation 809, the processor 210 may transmit the control command to the external device. According to an embodiment, the processor 210 may transmit the control command to the external device by using the interface connected with the external device.

Figure 9:
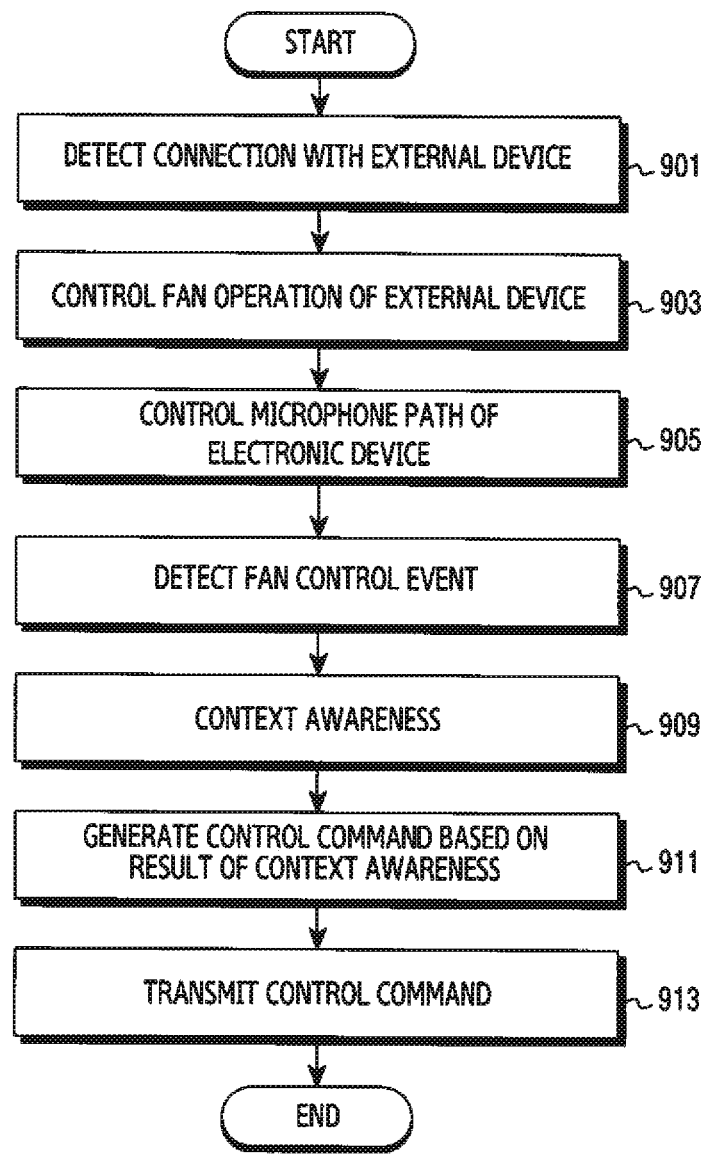
FIG. 9 is a flowchart illustrating an operating method of the electronic device according to various embodiments of the disclosure.

FIG. 9 is a flowchart illustrating an operating method of the electronic device according to various embodiments of the disclosure.

Referring to FIG. 9, in various embodiments, FIG. 9 illustrates that, when the electronic device and the external device are connected with each other, the microphone path of the electronic device is controlled and the fan of the external device is controlled based on a result of context awareness.

In operation 901, the processor 210 of the electronic device may detect a connection between the electronic device and the external device (for example, a docking station). According to an embodiment, the processor 210 may be electrically connected through an interface (for example, the interface 270 of FIG. 2, a type C interface) set for connection between the electronic device and the external device.

In operation 903, in response to the connection with the external device being detected, the processor 210 may control driving of the fan of the external device. According to an embodiment, when the external device is connected through the set interface, the processor 210 may identify the external device. When the external device is identified as an external device provided with a cooling function (for example, provided with a fan) (for example, a docking station), the processor 210 may transmit a control signal (for example, a fan driving signal) for driving the fan to the external device through the set interface.

In operation 905, the processor 210 may control the microphone path of the electronic device. According to an embodiment, in response to the connection with the external device being detected, the processor 210 may change the microphone path from the first microphone to the second microphone. According to an embodiment, when the external device is connected, the electronic device may change the transmission and reception path of the microphone to a microphone that is less influenced by the external device (for example, is less influenced by a noise caused by the fan operation of the external device).

In various embodiments, the order of operations 903 and 905 are just for convenience of explanation and better understanding, and is not limited to the above-described order. For example, operations 903 and 905 may be performed in reverse order, that is, operation 903 may be performed after operation 905, or operations 903 and 905 may be performed in parallel.

In operation 907, the processor 210 may detect a fan control event related to a fan control of the external device. According to an embodiment, the fan control event may include an event related to changing an operation state of the fan driven in operation 903. For example, the fan control event may include a trigger event for activating the microphone and/or the speaker. According to various embodiments, the trigger event may include an event of receiving a call from the outside (for example, another electronic device), an event of sending a call by the electronic device, a speech recognition function (or application) execution event, an event related to use of the speaker (for example, a music replay, a video replay, etc.).

In operation 909, the processor 210 may perform context awareness. According to an embodiment, the processor 210 may perform context awareness regarding at least part of a function (or application) performed by the electronic device or temperature of the electronic device, in response to the connection with the electronic device being detected.

In operation 911, the processor 210 may generate a control command to control the fan of the external device, based on a result of the context awareness. For example, the processor 210 may generate a control command related to holding, stopping or changing the fan operation of the external device, based on the result of the context awareness.

According to an embodiment, the processor 210 may determine to turn off the fan operation of the external device when it is determined that a call function of the electronic device is performed. For example, when an application such as a call (for example, call reception, or call sending) is performed in the electronic device, the use of the microphone of the electronic device may be required. When the use of the microphone is required and the fan of the electronic device operates, a sound of the fan (for example, a noise) may be inputted to an input to the microphone. Accordingly, when the microphone is activated by performing the call application, the processor 210 may be set not to operate the fan of the external device even if the temperature of the electronic device is high.

According to an embodiment, when it is determined that a speech recognition function is performed, the processor 210 may determine to reduce a speed (or intensity) (for example, Rpm) of the fan operation of the external device, or to turn off the fan operation, based on a heat emission (or temperature) state of the electronic device. For example, when the speech recognition function is performed and the heat emission (or temperature) state of the electronic device is greater than or equal to a set reference, the processor 210 may be set to reduce the speed of the operation of the fan. For example, when the speech recognition function is performed and the heat emission (or temperature) state of the electronic device is less than the set reference, the processor 210 may be set not to operate the fan. For example, when the speech recognition function is performed, the processor 210 may be set to control the operation of the fan at a speed for each heat emission state, according to the heat emission (or temperature) state of the electronic device. For example, when the electronic device is in a first heat emission state, the processor 210 may control to turn off the fan, and, when the electronic device is in a second heat emission state, the processor 210 may control the fan to operate at a low speed. When the electronic device is in the second heat emission state higher than the first heat emission state, the processor 210 may control the fan to operate at a medium speed. According to various embodiments, the fan control according to the heat emission (or temperature) state of the electronic device in various embodiments will be described in detail below with reference to the drawings, which will be described below.

In operation 913, the processor 210 may transmit the control command to the external device. According to an embodiment, the processor 210 may transmit the control command to the external device by using the interface connected with the external device.

Figure 10:
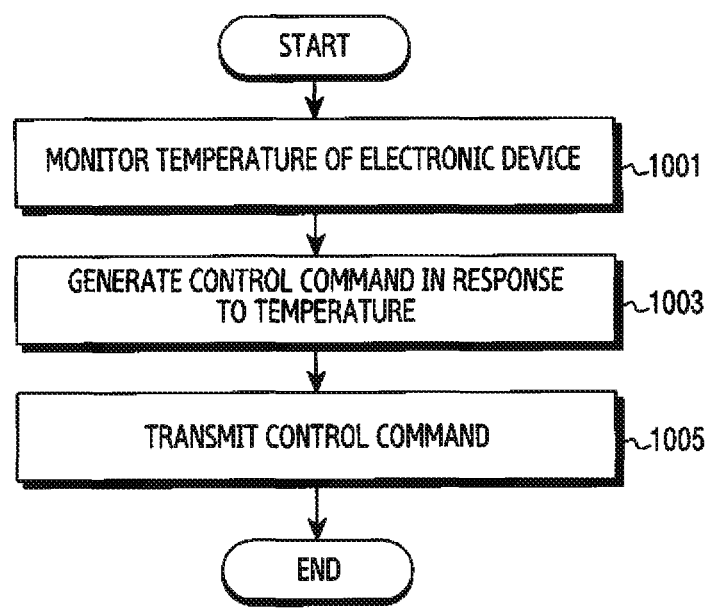
FIG. 10 is a flowchart illustrating an operating method of the electronic device according to various embodiments of the disclosure.

FIG. 10 is a flowchart illustrating an operating method of the electronic device according to various embodiments of the disclosure.

Referring to FIG. 10, in various embodiments, FIG. 10 illustrates that, when the electronic device and the external device are connected with each other, the fan of the external device is controlled based on temperature (or heat emission state) of the electronic device.

In operation 1001, the processor 210 of the electronic device may monitor temperature of the electronic device. According to an embodiment, in the state in which the electronic device and the external device are connected with each other, the processor 210 may determine temperature of the electronic device based at least in part on a sensor value measured by at least one sensor (for example, a temperature sensor). According to various embodiments, the processor 210 may determine the temperature of the electronic device based at least in part on a set period and/or a specific interrupt detection time, or a regular method.

In operation 1003, the processor 210 may generate a control command in response to the temperature of the electronic device. According to an embodiment, as shown in table 1 presented below, the processor 210 may generate a control command to stop the operation of the fan, a control command to operate the fan at a first speed (for example, a weak mode), a control command to operate the fan at a second speed (for example, a medium mode), or a control command to operate the fan at a third speed (for example, a strong mode), in response to the temperature (for example, a temperature range) of the electronic device.

In operation 1005, the processor 210 may transmit the control command to the external device by using an interface connected with the external device.

According to an embodiment, when a first function (for example, a microphone-based speech recognition function or a speaker-based audio output function) is performed by the electronic device, the processor 210 may control the fan according to a temperature state of the electronic device in a different way from that in the normal situation. For example, the processor 210 may provide a control command to control the fan of the external device to stop when the temperature state of the electronic device falls within a first range (for example, 30° C. or higher but less than 36° C.),

TABLE 1

| Classification | 30° C.~33° C. | 33° C.~36° C. | 36° C.~39° C. | 39° C.~42° C. | 42° C. or higher |
|---|---|---|---|---|---|
| Normal | Fan stop | Weak mode | Strong mode | Strong mode | Strong mode |
| First function | Fan stop | Fan stop | Weak mode | Medium mode | Strong mode |
| Second function | Fan stop | Fan stop | Fan stop | Fan stop | Weak mode |

As shown in the example of table 1, the electronic device may divide temperatures into a plurality of temperature ranges, and may differently control the fan operation of the external device according to the divided temperature ranges. In various embodiments, when the fan operations are identified according to the temperature ranges, the fan operation may be controlled according to a type of an ongoing function (or application) differently from the fan operation control in normal situations. In various embodiments, the temperature ranges and fan control states according to the temperature ranges and the respective situations are merely examples for easy explanation and better understanding of the technical features of various embodiments, and are not intended to limit the scope of various embodiments.

According to various embodiments, in a normal situation, the processor 210 may set a control command to control the fan to stop when the temperature state of the electronic device falls within a first range (for example, 30° C. or higher but less than 33° C.), to control the fan to operate in a weak mode (for example, a low-speed wind strength) when the temperature state falls within a second range (for example, 33° C. or higher but less than 36° C.), and to control the fan to operate in a strong mode (for example, a high-speed wind strength) when the temperature state falls within a third range (for example, 36° C. or higher). For example, when the temperature of the electronic device is low, the electronic device may control the fan to stop or to operate at a low speed, and, when the temperature of the electronic device is high, the electronic device may control the fan to operate at a high speed.

According to various embodiments, the processor 210 may control the fan of the external device when the electronic device is in a normal situation, and also, may control the fan differently according to a type of a function (or application) ongoing in the electronic device.

to control the fan to operate in the weak mode when the temperature state falls within a second range (for example, 36° C. or higher but less than 39° C.), to control the fan to operate in the medium mode when the temperature state falls within a third range (for example, 39° C. or higher but less than 42° C.), or to control the fan to operate in the strong mode when the temperature state falls within a fourth range (for example, 42° C. or higher).

According to an embodiment, when a second function (for example, a microphone-based call function) is performed by the electronic device, the processor 210 may provide a control command to control the fan of the external device to stop when the temperature state falls within a first range (for example, 30° C. or higher but less than 42° C.), and to control the fan to operate in the weak mode when the temperature state falls a second range (for example, 42° C. or higher).

According to various embodiments, the processor may provide the control command in response to the temperature of the electronic device and the operation mode of the electronic device. According to an embodiment, the processor 210 may generate a control command to stop the operation of the fan or to change the operation speed of the fan in response to temperature (for example, a temperature range) of the electronic device and an operation mode (for example, a first operation mode, a second operation mode, a third operation mode, etc.) of the electronic device, as shown in an example of table 2 presented below. Additionally or alternatively, the processor 210 according to various embodiments may identify a trigger event prior to generating a control command according to temperature, and may generate a control command based at least in part on the trigger event and temperature.

TABLE 2

| Classification | 30° C.~33° C. | 33° C.~36° C. | 36° C.~39° C. | 39° C.~42° C. | 42° C. or higher |
|---|---|---|---|---|---|
| First operation mode | Fan stop | Weak mode | Strong mode | Strong mode | Strong mode |
| Second operation mode | Fan stop | Weak mode after fan stop for N seconds | | Medium mode | Strong mode |
| Third operation mode | | | Fan stop | Weak mode | Strong mode |

As shown in the example of table 2, the electronic device may divide temperatures into a plurality of temperature ranges, and may control the fan operation differently according to an operation mode of the electronic device in a divided temperature range. In various embodiments, the fan control states according to the temperature ranges and the operation modes shown in the example of table 2 are merely examples for easy explanation and better understanding of the technical features of various embodiments, and are not intended to limit the scope of various embodiments.

According to various embodiments, when the electronic device is in the first operation mode (for example, a normal situation), the processor 210 may process an operation corresponding to the operation related to the normal situation explained above with reference to table 1 described above.

According to various embodiments, in the second operation mode (for example, a fan holding mode), the electronic device may hold the fan of the external device during a predetermined time (for example, N seconds, wherein N is a natural number) within a predetermined temperature range (for example, 33° C. or higher, but less than 39° C.), and, after the predetermined time, may control the fan to operate at an operation speed (for example, a weak mode) of the fan set for the corresponding temperature range. According to an embodiment, the electronic device may analyze an operation of an ongoing application and detect a pause section, and may adaptively control the fan according to a result of the analysis. In various embodiments, the pause section may include, for example, a silence section between sound sources, a waiting section during a call, etc.

According to various embodiments, in the third operation mode (for example, when there is a system request for receiving/sending a call, for turning on/off a display), the processor 210 may stop the operation of the fan when the temperature of the electronic device is low (or normal), and may differently control an operation speed of the fan based on a temperature range when the temperature of the electronic device is high (for example, a heat emission state).

Additionally or alternatively, according to various embodiments, a mode in which a function set to use at least one of the microphone or the speaker of the electronic device is performed may be set as the first operation mode, and a mode in which a function set not to use at least one of the microphone or speaker of the electronic device is performed may be set as the second operation mode. According to various embodiments, the processor 210 may generate a control command (for example, a first control command, a second control command) to control the speed of the operation of the fan of the external device in a different method (for example, a first method, a second method) according to the first operation mode and the second operation mode, and may control the operation of the fan of the external device.

According to various embodiments, when a call function of the electronic device is performed (for example, a call is sent or received), the fan of the external device may be turned off to remove a noise input by the fan. Additionally, when the call function of the electronic device is performed and a heat emission state of the electronic device reaches a critical level (for example, greater than or equal to a set reference value), the fan of the external device may be controlled to operate at a constant speed in consideration of stability. According to various embodiments, when a speech recognition function or an audio output function of the electronic device is performed and the heat emission state of the electronic device is good (a temperature set not to cause heat emission), the fan of the external device may be turned off or the speed (for example, intensity) of the fan of the external device may be reduced to the extent that the speech recognition function or the audio output function can be performed.

According to various embodiments as described above, the fan operation of the external device may be adaptively controlled based at least in part on various states of the electronic device (for example, temperature, ambient temperature, a charging state, a state of an ongoing function (or application), a state of occurrence of a trigger event for using the microphone and/or the speaker).

In various embodiments, the fan of the external device may be controlled differently according to a type of an ongoing function (or application) (for example, a function-prioritized type, a heat emission control-prioritized type). In various embodiments as described above, the speech recognition and call sending/receiving performance can be stably operated even when the fan operates (for example, in an on-state). In various embodiments, the fan control of the external device according to the type of the function (or application) of the electronic device will be described in detail below with reference to the drawings, which will be described below.

Figure 11:
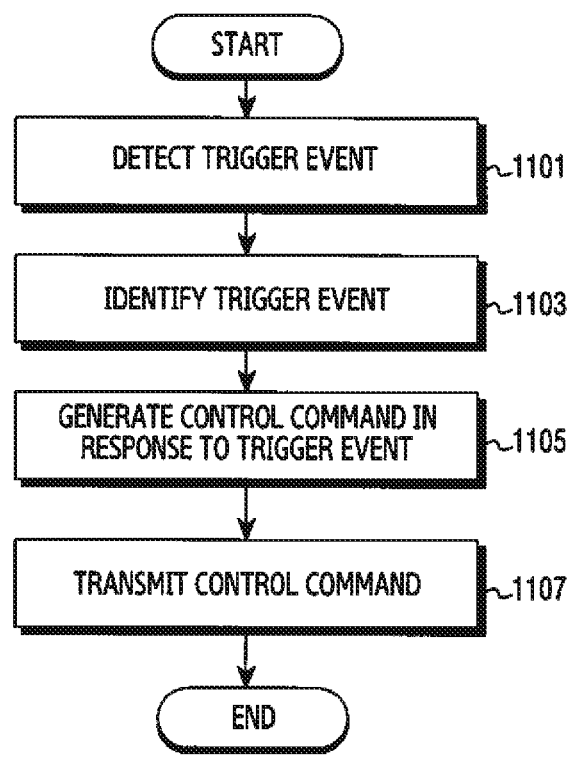
FIG. 11 is a flowchart illustrating an operating method of the electronic device according to various embodiments of the disclosure.

FIG. 11 is a flowchart illustrating an operating method of the electronic device according to various embodiments of the disclosure.

Referring to FIG. 11, in various embodiments, FIG. 11 illustrates that, when the electronic device and the external device are connected with each other, the fan of the external device is controlled based on a trigger event of the electronic device.

In operation 1101, the processor 210 of the electronic device may detect a trigger event. According to an embodiment, in the state in which the electronic device and the external device are connected with each other, the processor 210 may detect occurrence of a trigger event related to activation of the microphone and/or speaker. For example, the processor 210 may determine the occurrence of the trigger event based at least in part on detection of a call received from the outside (for example, another electronic device), detection of a call sent by a user, detection of execution of a speech recognition function (or application), or detection of execution of a function (or application) related to use of the speaker.

In operation 1103, the processor 210 may identify the trigger event. According to an embodiment, the processor 210 may determine whether the trigger event is an event related to use of the microphone (for example, call reception, call sending, execution of the speech recognition function, etc.) or an event related to use of the speaker (for example, a music replay, a video replay, etc.).

In operation 1105, the processor 210 may generate a control command in response to the trigger event. According to an embodiment, when the trigger event is a call function, the processor 210 may generate a first control command related to the call function. According to an embodiment, when the trigger event is a speech recognition function, the processor 210 may generate a second control command related to the speech recognition function. According to an embodiment, when the trigger event is an event related to a multimedia replay (for example, a music replay or a video replay) function, the processor 210 may generate a third control command related to the multimedia replay function. According to various embodiments, the processor 210 may consider a temperature state of the electronic device when generating the first control command, the second control command, or the third control command.

In operation 1107, the processor 210 may transmit the control command to the external device by using an interface connected with the external device.

According to various embodiments, a fan control and an associated function may be variously changed according to a type of an application ongoing in the electronic device. According to an embodiment, when an application using a function of a microphone is used, the electronic device may activate a microphone that is less influenced by a fan sound. According to an embodiment, when an application using a speaker is used, the electronic device may change a value of a volume according to a degree of reduction of the speed of the fan. For example, the electronic device may change the volume to be larger than a volume set according to a noise according to a speed of the existing fan, and, when the speed of the fan is reduced, the electronic device may change the volume to an original volume level.

According to various embodiments, the electronic device may determine a fan control operation and an additional operation according to a type of an application. According to various embodiments, as shown in an example of table 3 presented below, a priority according to sensitivity (for example, highest, high, medium, low) of an external sound may be set for each application, and the operation of the fan may be controlled accordingly.

Table 3 presented below illustrates an example of a fan operation control according to a function (or application) of the electronic device in various embodiments. The fan operation control states according to the functions shown in the example of table 3 are merely examples for easy explanation and better understanding of the technical features of various embodiments, and are not intended to limit the scope of various embodiments. For example, the sensitivity of the item "Call" may be set to "high" and the sensitivity of the item "speech recognition" may be set to "highest", and corresponding operations may be performed. In various embodiments, fan operation control setting according to each application may be changed through an application such as environment setting.

TABLE 3

| Applications | Sensitivity | Operations |
|---|---|---|
| CALL | Highest | Fan stop, microphone path change |
| Speech recognition | High | Fan 20% reduction, microphone path change |
| Video replay | Medium | Fan 50% reduction, volume control |
| . . . | . . . | . . . |

According to various embodiments, in the case of the CALL application, sender information may be reflected on the fan control operation. For example, when a receiver receives an undesired call, such as an advertisement call, a spam call, a call corresponding to a block sender list, the fan operation of the external device may operate as it is according to system setting. For example, even when the electronic device performs a relevant application, the fan operation of the external device may operate as it is according to system setting until the microphone function is activated.

According to various embodiments, the electronic device may analyze an operation of an application and may detect a pause section, and may adaptively control the fan according to a result of the analysis. In various embodiments, the pause section may include a silence section between sound sources, a waiting section during a call.

Figure 12:
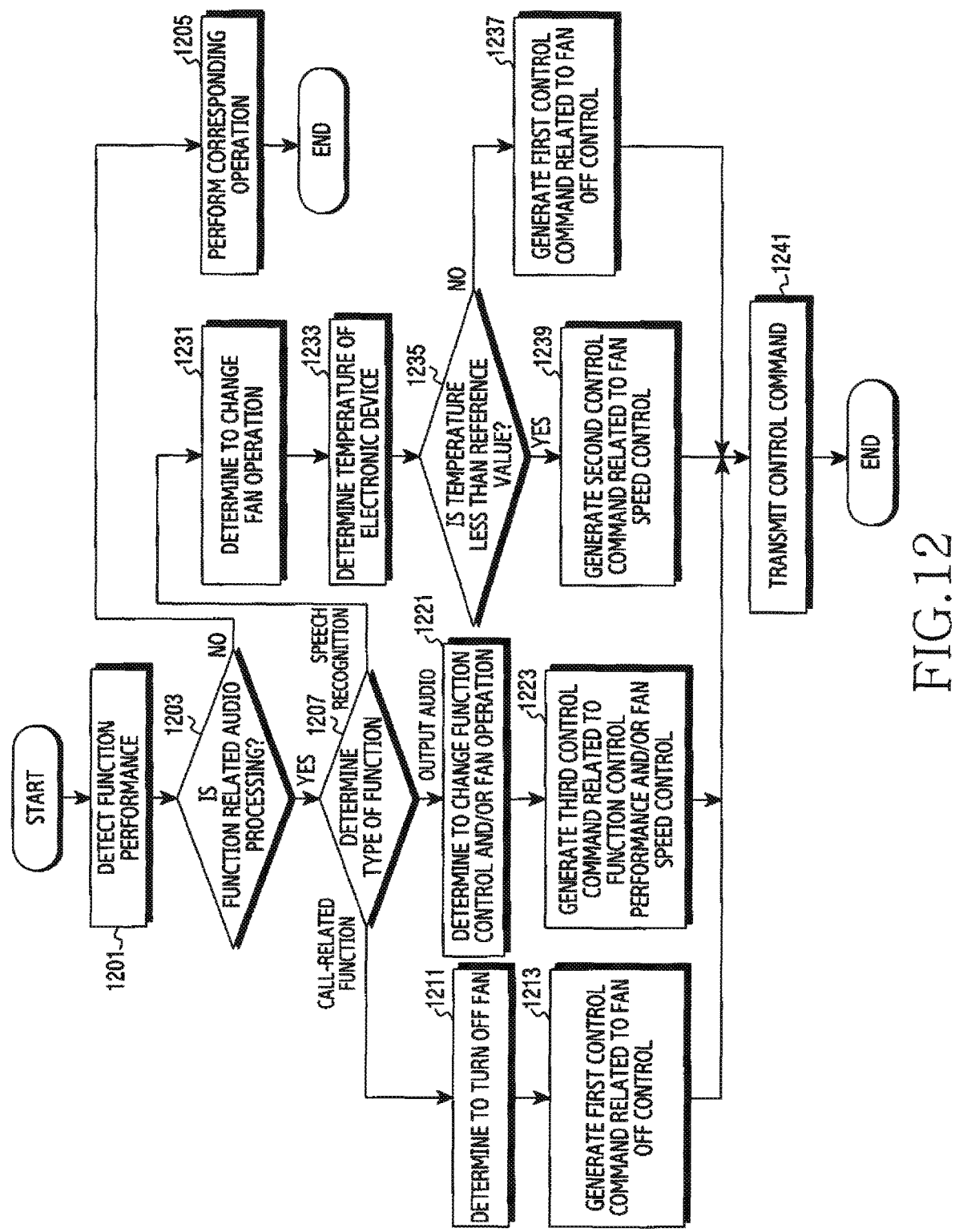
FIG. 12 is a flowchart illustrating an operating method of the electronic device according to various embodiments of the disclosure.

FIG. 12 is a flowchart illustrating an operating method of the electronic device according to various embodiments of the disclosure.

Referring to FIG. 12, in various embodiments, FIG. 12 illustrates an example of controlling the fan of the external device based on a type of a function (or application) performed in the electronic device.

In operation 1201, the processor 210 of the electronic device may detect function performance. According to an embodiment, in the state in which the electronic device and the external device are connected with each other, the processor 210 may detect a request for execution of an application by a user or from the outside.

In operation 1203, the processor 210 may determine whether the performed function is an audio processing-related function. According to an embodiment, in response to the function performance being detected, the processor 210 may identify whether the performed function is a function that is operated by activating the microphone and/or speaker.

In operation 1203, when it is determined that the performed function is not the audio processing-related function (No in operation 1203), the processor 210 may perform a corresponding operation in operation 1205. According to an embodiment, the processor 210 may not perform an operation related to a fan control of the external device according to the function performance.

In operation 1203, when it is determined that the performed function is the audio processing-related function (Yes in operation 1203), the processor 210 may determine a type of the function in operation 1207. According to an embodiment, the processor 210 may determine whether the performed function is a call-related function, an audio output-related function, or a speech recognition-related function.

In operation 1207, when it is determined that the performed function is the call-related function, the processor 210 may determine to turn off the fan in operation 1211. According to various embodiments, when the electronic device performs the call-related function while being connected with the external device, and the microphone path is set to a lower end microphone, the processor 210 may further perform an operation of changing the microphone path to an upper end microphone.

In operation 1213, the processor 210 may generate a first control command related to the control to turn off the fan of the external device based on a result of the determination. According to an embodiment, as shown in the example of table 3, the processor 210 may generate a control command to stop the operation of the fan while changing the microphone path of the electronic device.

In operation 1207, when the performed function is the audio output-related function, the processor 210 may determine to change a function control and/or fan operation in operation 1221. According to an embodiment, when the application is an application using a speaker, the processor 210 may determine to reduce the speed of the fan (or turn off) and to change the volume.

In operation 1223, the processor 210 may generate a third control command related to the function control of the electronic device and/or control of the speed of the fan (for example, reduction or turning off), based on a result of the determination. According to an embodiment, as shown in the example of table 3, the processor 210 may generate a control command to reduce the operation speed of the fan by 50% of a default speed (for example, 100%), while controlling the volume of the electronic device.

In operation 1207, when it is determined that the performed function is the speech recognition-related function, the processor 210 may determine to change the fan operation in operation 1231. According to various embodiments, when the electronic device performs the speech recognition-related function while being connected with the external device, and the microphone path is set to a lower end microphone, the processor 210 may further perform an operation of changing the microphone path to an upper end microphone.

In operation 1223, the processor 210 may determine temperature (or heat emission state) of the electronic device. According to an embodiment, the processor 210 may determine the temperature of the electronic device based at least in part on a sensor value measured by at least one sensor (for example, a temperature sensor).

In operation 1235, the processor 120 may determine whether the temperature of the electronic device is less than a reference value, based on a result of the determination.

In operation 1235, when it is determined that the temperature of the electronic device is not less than the reference value (No in operation 1235), for example, when it is determined that the temperature of the electronic device is greater than or equal to the reference value, the processor 210 may generate a first control command related to controlling to turn off the fan in operation 1237.

In operation 1235, when it is determined that the temperature of the electronic device is less than the reference value (Yes in operation 1235), the processor 210 may generate a second control command related to controlling the speed of the fan (for example, reduction) in operation 1239. According to an embodiment, as shown in in the example of table 3, the processor 210 may generate a control command to reduce the operation speed of the fan by 20% of the default speed (for example, 100%).

In operation 1241, the processor 210 may transmit the control command generated in operation 1213, 1223, 1237, or 1239 to the external device by using an interface set for connection with the external device.

Figure 13:
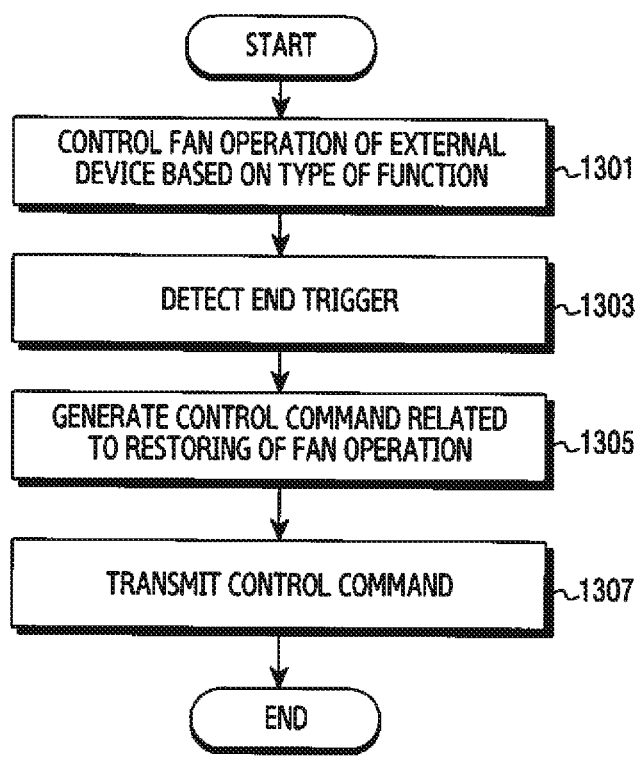
FIG. 13 is a flowchart illustrating an operating method of the electronic device according to various embodiments of the disclosure.

FIG. 13 is a flowchart illustrating an operating method of the electronic device according to various embodiments of the disclosure.

Referring to FIG. 13, in various embodiments, FIG. 13 illustrates an example of controlling the fan of the external device based on an end trigger of a performed function after controlling the fan according to function performance of the electronic device.

In operation 1301, the processor 210 of the electronic device may control the fan operation of the external device based on a type of a function. According to an embodiment, the processor 210 may control the fan operation by transmitting a control command according to a type of a function in the state in which the electronic device and the external device are connected with each other, as shown in the example of FIG. 12 described above.

In operation 1303, the processor 210 may detect an end trigger. According to an embodiment, the processor 210 may control the fan operation according to function performance, and may detect that the function ends in the middle of processing an operation related to the performed function. For example, the processor 210 may detect that the performed function such as a call, speech recognition, or a multimedia replay ends.

In operation 1305, the processor 210 may generate a control command related to restoring of the fan operation in response to the end trigger being detected. According to an embodiment, the processor 210 may generate a control command to control the fan of the external device to operate at a default speed (for example, 100%) or at a speed set according to system setting in a normal situation. According to various embodiments, the processor 210 may consider a current charging power of the electronic device and/or current temperature (or heat emission state) of the electronic device when generating the control command.

In operation 1307, the processor 210 may transmit the control command to the external device by using an interface set for connection with the external device.

Figure 14:
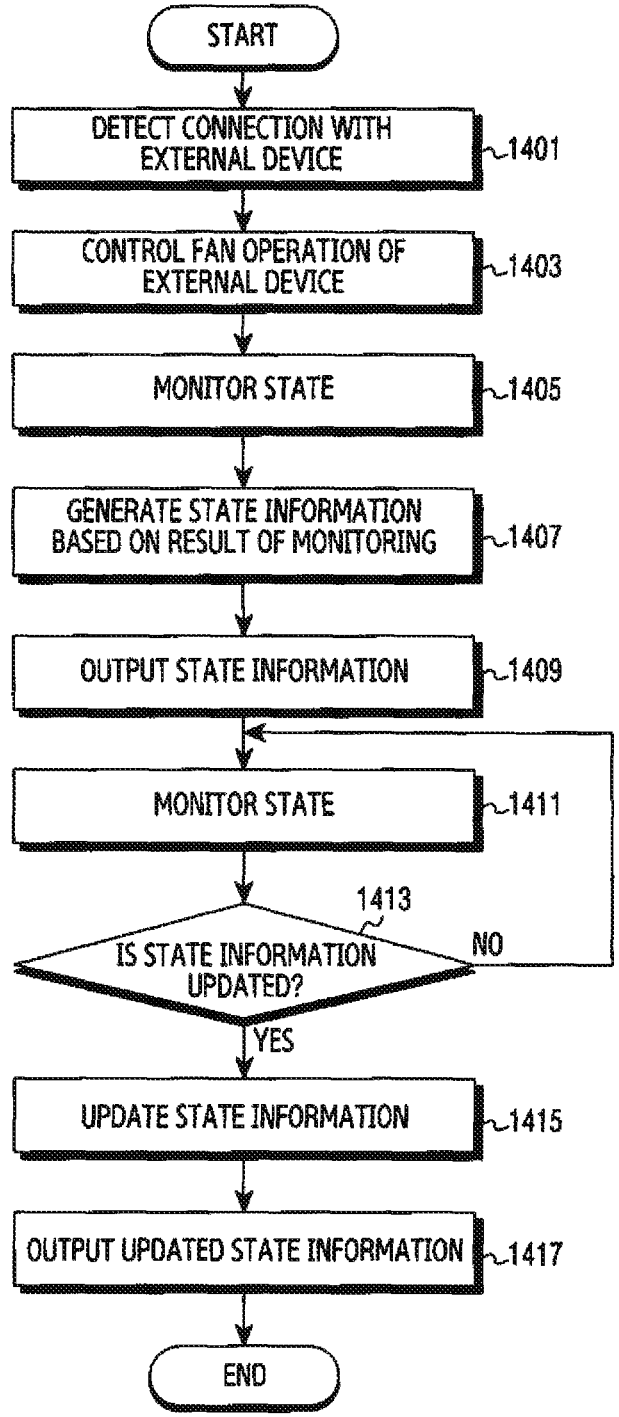
FIG. 14 is a flowchart illustrating an operating method of the electronic device according to various embodiments of the disclosure.

FIG. 14 is a flowchart illustrating an operating method of the electronic device according to various embodiments of the disclosure.

Referring to FIG. 14, in various embodiments, FIG. 14 illustrates an example of providing feedback to a user regarding a fan control of the external device according to a state of the electronic device.

In operation 1401, the processor 210 of the electronic device may detect a connection between the electronic device and the external device (for example, a docking station). According to an embodiment, the processor 210 may be electrically connected through an interface (for example, the interface 270 of FIG. 2, a type C interface) set for connection between the electronic device and the external device.

In operation 1403, the processor 210 may control the fan operation of the external device in the state in which the electronic device and the external device are connected with each other.

In operation 1405, the processor 210 may monitor a state of the fan and a state of the electronic device according to the fan control of the external device. According to an embodiment, after controlling the fan of the external device, the processor 210 may check a state of the controlled fan (for example, a weak mode, a medium mode, a strong mode, or an off mode), and temperature (or heat emission state) of the electronic device.

In operation 1407, the processor 210 may generate state information based on a result of the monitoring. According to an embodiment, the processor 210 may generate state information based on at least one piece of information related to the temperature of the electronic device, the speed of the fan, or an estimated holding time of the electronic device for controlling heat emission.

In operation 1409, the processor 210 may output the state information. According to an embodiment, the processor 210 may display a visual output in the form of a text, a graphic, a video, or a combination thereof through the display of the electronic device. According to various embodiments, when outputting the state information, the processor 210 may provide the output of the state information differently by considering an operation state of the electronic device (for example, a display operation state (for example, whether the display is turned on/off, a normal mode/always on display (AOD) mode), or a function performance state, etc.). For example, when the display is in the off state (or does not perform a function), the processor 210 may provide the state information to the user based on a pop-up window including detailed state information. In another example, when the display is in the on state (or performs a function), the processor 210 may provide the state information to the user based on a mini pop-up window including rough state information. This will be described with reference to FIGS. 15A and 15B, which will be described below.

In operation 1411, the processor 210 may continuously monitor the state of the electronic device after outputting the state information.

In operation 1413, the processor 210 may determine whether the state information is updated, based on a result of the monitoring. According to an embodiment, the processor 210 may compare first state information currently provided through the display, and second state information currently monitored, based on the result of the monitoring. When a difference (or change) in at least one piece of information (for example, information related to the temperature of the electronic device, the speed of the fan, or an estimated holding time of the electronic device for controlling heat emission) between the first state information and the second state information is detected, the processor 210 may determine that the state information is updated.

In operation 1413, when it is determined that there is no change in the state information (No in operation 1413), the processor 210 may resume operation 1411 and may process operation performance after operation 1411.

In operation 1413, when it is determined that there is a change in the state information (Yes in operation 1413), the processor 210 may update the state information in operation 1415. According to an embodiment, the processor 210 may update the state information based on changed information (for example, temperature, a remaining time, a fan speed, etc.).

In operation 1417, the processor 210 may output the updated state information.

Figures 15A, 15B:
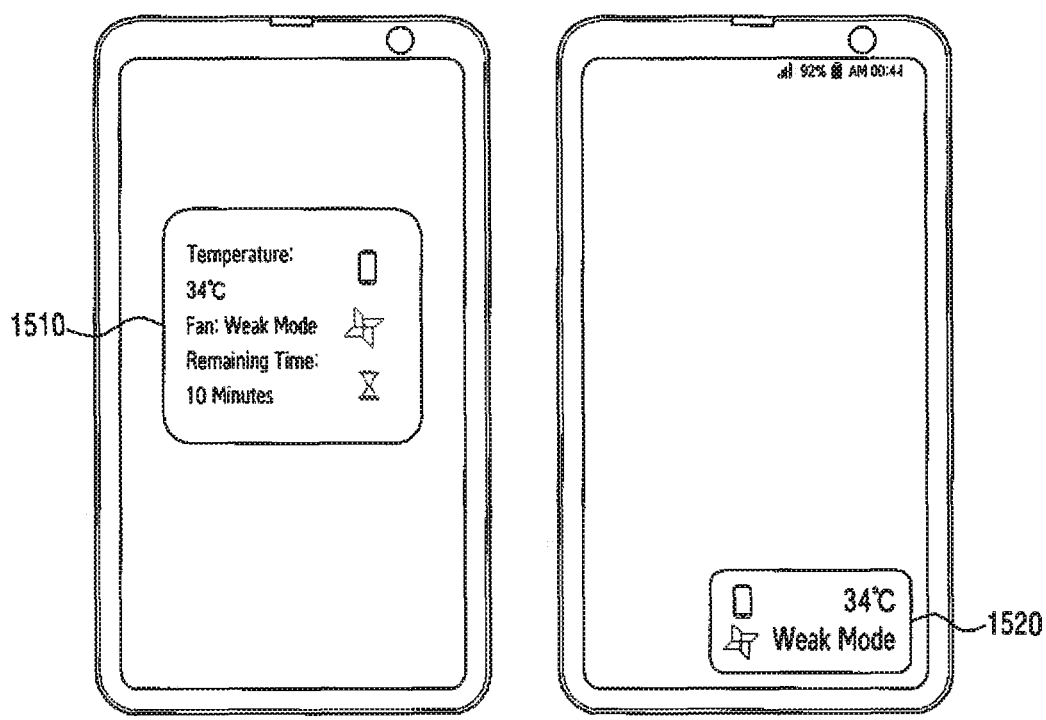
FIGS. 15A and 15B illustrate an example of a user interface providing state information in an electronic device according to various embodiments of the disclosure.

FIGS. 15A and 15B illustrate a user interface providing state information in the electronic device according to various embodiments.

Referring to FIGS. 15A and 15B, in various embodiments, an example is provided of displaying state information differently by considering an operation state of the electronic device (for example, a display operation state (for example, whether the display is turned on/off, a normal mode/AOD mode), etc.).

In various embodiments, FIG. 15A illustrates that state information is provided when the display of the electronic device is in the off state (or a function is not performed), and FIG. 15B illustrates that state information is provided when the display of the electronic device is in the on state (or a function is performed).

As shown in FIG. 15A, when the displays is in the off state (or when a function is not performed although the display is in the on state (for example, a home screen state, etc.)), the electronic device may output detailed state information based on an extended pop-up window 1510.

In various embodiments, the detailed state information may include, for example, information items (for example, temperature, FAN, a remaining time, etc.), a state value corresponding to each item (for example, 34, weak mode, 10 minutes), and an object for identifying each item (for example, an icon indicating an electronic device, a pinwheel, sandglass). According to various embodiments, the extended pop-up window 1510 may be provided in the method of always on display (AOD), for example, in the off state of the display.

As shown in FIG. 15B, the electronic device may output rough state information based on a mini pop-up window 1520 when the display is in the on state (or a function performance state (for example, an application execution state, an AOD mode operation state)).

In various embodiments, the rough state information may omit display of at least partial information (for example, information items (for example, temperature, FAN, remaining time, etc.), some state information (for example, a remaining time), etc.), and may include, for example, an object identifying an item (for example, an icon of an electronic device, a pinwheel, etc.), a state value (for example, 34, a weak mode, etc.) corresponding to each item.

For example, the rough state information may be configured by contracting the detailed state information or excluding at least some information.

In various embodiments, the mini pop-up window 1520 may be provided through a region (for example, an edge region of the display) that is set not to block user's vision. In various embodiments, the mini pop-up window 1520 may be provided in a floating method and its display position may be changed (or moved) according to a user interaction.

In various embodiments, the popup window 1510, 1520 may be invoked and displayed on the display based on a user interaction, and the popup window 1510, 1520 displayed based on the user interaction may be controlled not to be displayed on the display. According to various embodiments, the popup window 1510, 1520 may be set to be automatically displayed according to system setting when the electronic device is connected with the external device.

According to various embodiments, when the popup window 1510, 1520 is turned off (for example, is not displayed through the display), feedback regarding the operation of the fan of the external device may be provided to the user by using an LED lamp provided in the electronic device. According to an embodiment, feedback related to the operation of the fan may be provided to the user by differently setting a flickering interval (or speed) (for example, a first interval, a second interval, a third interval) of the LED lamp according to an operation speed of the fan (for example, a first speed, a second speed, a third speed, or the like).

According to various embodiments as described above, when the electronic device is held in the external device (for example, a docking station), a heat emission state of the electronic device and state information of the fan operation may be displayed on the display in the form of an icon or a notification. In various embodiments, the state information may include a heat emission state of the electronic device, a fan control speed, a fan operation remaining time (for example, an estimated time taken until the temperature of the electronic device reaches normal temperature). According to various embodiments, the user may identify a heat emission state by using the state information after a specific function of the electronic device is performed, and may perform an operation of extending the holding time of the electronic device to control the heat emission.

As described above, an operating method of an electronic device according to various embodiments may include: detecting a connection with an external device by using an interface set to connect with the external device; determining a state of the electronic device based at least on the detection of the connection with the external device; and transmitting a command related to a control of a fan operation of the external device to the external device by using the interface, based at least on the state of the electronic device.

According to various embodiments, the determining may include: receiving a charging power of the external device by using the interface; and determining the state of the electronic device based on the charging power, and the method may further include: generating a command to control the fan operation of the external device based at least on the determined state of the electronic device; and transmitting the command to the external device by using the interface.

According to various embodiments, the determining may include: determining the state of the electronic device when the electronic device is connected with the external device; when the state of the electronic device is a state for changing the fan operation, generating a command related to the state of the electronic device; and transmitting the command to the external device by using the interface.

According to various embodiment, the generating the command may include determining a temperature of the electronic device, and generating the command based at least on the temperature of the electronic device.

According to various embodiments, the generating may include determining a performed function of the electronic device, and generating the command based on a type of the performed function of the electronic device According to various embodiments, the generating may include: determining a performed function of the electronic device; and, when the performed function of the electronic device is a function that is set to use a microphone or a speaker of the electronic device, generating a command to turn off the fan or to control an operation speed of the fan.

According to various embodiments, the generating may include: when the performed function is a first function that uses the microphone, generating a first command to stop the operation of the fan regardless of a temperature of the electronic device; and, when the performed function is a second function that uses the microphone or the speaker, generating a second command to change the operation of the fan based on the temperature of the electronic device.

According to various embodiments, the electronic device may further include an operation of changing a microphone path of the electronic device based at least on the detection of the connection with the external device.

According to various embodiments, the method may include: monitoring a state of the fan or a state of the electronic device according to a control of the fan of the external device; generating state information based on a result of the monitoring; and outputting the state information by using the display, and the outputting may include displaying the state information differently based on an operation state of the display.

In addition, the embodiments disclosed in the disclosure and the drawings are suggested for easy explanation and better understanding of the disclosed technical features, and are not intended to limit the scope of the disclosure. Therefore, the scope of the disclosure should be interpreted as including all changes or modified forms derived based on the technical idea of the disclosure, in addition to the embodiments disclosed herein.

What is claimed is:
1. An electronic device comprising:
an interface configured to connect with an external device; and
a processor electrically connected with the interface, wherein the processor is configured to:
detect a connection with the external device by using the interface;
determine a state of the electronic device based at least on the detection of the connection with the external device; and
transmit a control signal related to a control of a fan operation of the external device to the external device by using the interface, based at least on the state of the electronic device.

2. The electronic device of claim 1, wherein the processor is configured to:
receive a charging power of the external device by using the interface;
determine a state of the electronic device based on the charging power;
generate a control signal for controlling the fan operation of the external device based at least on the determined state of the electronic device; and
transmit the control signal to the external device by using the interface.

3. The electronic device of claim 2, wherein the processor is configured to:
determine the state of the electronic device when the electronic device is connected with the external device;
when the state of the electronic device is a state for changing the fan operation, generate a control signal related to the state of the electronic device; and
transmit the control signal to the external device by using the interface.

4. The electronic device of claim 3, wherein the processor is configured to determine a temperature of the electronic device, and to generate the control signal based at least on the temperature of the electronic device.

5. The electronic device of claim 3, wherein the processor is configured to:
determine a performed function of the electronic device; and
when the performed function of the electronic device is a function that is set to use a microphone or a speaker of the electronic device, generate a control signal to turn off the fan or to control an operation speed of the fan.

6. The electronic device of claim 5, wherein the processor is configured to:
when the performed function is a first function that uses the microphone, generate a first control signal to stop the operation of the fan regardless of a temperature of the electronic device; and
when the performed function is a second function that uses the microphone or the speaker, generate a second control signal to change the operation of the fan based on the temperature of the electronic device.

7. The electronic device of claim 1, wherein the processor is configured to change a microphone path of the electronic device based at least on the detection of the connection with the external device.

8. The electronic device of claim 1, further comprising a display,
wherein the processor is configured to:
monitor a state of the fan or a state of the electronic device according to a control of the fan of the external device;
generate state information based on a result of the monitoring; and
output the state information by using the display.

9. The electronic device of claim 8, wherein the processor is configured to display the state information differently based on an operation state of the display.

10. The electronic device of claim 1, wherein the processor is configured to:
identify an operation mode of the electronic device based on a state of the electronic device;
when the identified operation mode is a first operation mode, transmit, to the external device by using the interface, a first control signal to control an operation speed of the fan of the external device in a first method corresponding to the first operation mode; and
when the identified operation mode is a second operation mode, transmit, to the external device by using the interface, a second control signal to control the operation speed of the fan of the external device in a second method corresponding to the second operation mode.

11. The electronic device of claim 10, further comprising:
one or more microphones; and
one or more speakers,
wherein the processor is configured to:
when the electronic device is set to use the one or more microphones or the one or more speakers, identify the operation mode of the electronic device as the first operation mode, and
when the electronic device is set not to use the one or more microphones or the one or more speakers, identify the operation mode of the electronic device as the second operation mode.

12. The electronic device of claim 11, wherein the processor is configured to control one or more operations of the one or more microphones or the one or more speakers in the first method or the second method.

13. An operating method of an electronic device, the method comprising:
detecting a connection with an external device by using an interface set to connect with the external device;
determining a state of the electronic device based at least on the detection of the connection with the external device; and
transmitting a control signal related to a control of a fan operation of the external device to the external device by using the interface, based at least on the state of the electronic device.

14. The method of claim 13, wherein the determining comprises:
receiving a charging power of the external device by using the interface; and
determining the state of the electronic device based on the charging power,
wherein the method further comprises:
generating a control signal to control the fan operation of the external device based at least on the determined state of the electronic device; and
transmitting the control signal to the external device by using the interface.

15. The method of claim 13, wherein the determining comprises:
determining the state of the electronic device when the electronic device is connected with the external device;
when the state of the electronic device is a state for changing the fan operation, generating a control signal related to the state of the electronic device; and
transmitting the control signal to the external device by using the interface.

16. The method of claim 15, wherein generating the control signal comprises:
determining a temperature of the electronic device; and
generating the control signal based at least on the temperature of the electronic device.

17. The method of claim 15, wherein generating the control signal comprises:
determining a performed function of the electronic device; and
when the performed function of the electronic device is a function that is set to use a microphone or a speaker of the electronic device, generating a control signal to turn off the fan or to control an operation speed of the fan.

18. The method of claim 17, wherein generating the control signal to turn off the fan or to control an operation speed of the fan comprises:
when the performed function is a first function that uses the microphone, generating a first control signal to stop the operation of the fan regardless of a temperature of the electronic device; and
when the performed function is a second function that uses the microphone or the speaker, generating a second control signal to change the operation of the fan based on the temperature of the electronic device.

19. The method of claim 13, further comprising:
changing a microphone path of the electronic device based at least on the detection of the connection with the external device.

20. The method of claim 13, further comprising:
monitoring a state of the fan or a state of the electronic device according to a control of the fan of the external device;
generate state information based on a result of the monitoring; and
displaying on a display the state information.

\* \* \* \* \*